(12) United States Patent
Koo et al.

(10) Patent No.: US 12,108,620 B2
(45) Date of Patent: Oct. 1, 2024

(54) FOLDABLE DISPLAY DEVICE WITH BACKPLATE SLOTS

(71) Applicant: Microsoft Technology Licensing, LLC, Redmond, WA (US)

(72) Inventors: Hyun Woo Koo, Redmond, WA (US); Kabir Siddiqui, Sammamish, WA (US); Camilo Leon, Redmond, WA (US); Blake Reza Toicerkani, Wildomar, CA (US); Ying Zheng, Sammamish, WA (US); Rajesh Manohar Dighde, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 572 days.

(21) Appl. No.: 17/174,204

(22) Filed: Feb. 11, 2021

(65) Prior Publication Data
US 2022/0158124 A1    May 19, 2022

Related U.S. Application Data

(60) Provisional application No. 63/113,776, filed on Nov. 13, 2020.

(51) Int. Cl.
*H10K 50/84* (2023.01)
*H10K 102/00* (2023.01)

(52) U.S. Cl.
CPC ....... *H10K 50/84* (2023.02); *H10K 2102/311* (2023.02)

(58) Field of Classification Search
CPC .......................... H10K 50/84; H10K 2102/311

USPC ........................................................ 257/99
See application file for complete search history.

(56) References Cited

U.S. PATENT DOCUMENTS

| 10,303,218 B2 | 5/2019 | Jones et al. |
| 10,462,273 B2 | 10/2019 | Zhou et al. |
| 10,483,210 B2 | 11/2019 | Gross et al. |
| 10,600,989 B1 | 3/2020 | Ai et al. |

(Continued)

FOREIGN PATENT DOCUMENTS

| CN | 110599903 A | 12/2019 |
| KR | 20180062249 A | 6/2018 |

(Continued)

OTHER PUBLICATIONS

Abrahamson, et al., "Optically Clear Adhesives for OLED", In Journal of Luminescence-OLED Technology and Applications, Aug. 23, 2019, 28 Pages.

(Continued)

*Primary Examiner* — Xia L Cross
(74) *Attorney, Agent, or Firm* — Alleman Hall & Tuttle LLP

(57) ABSTRACT

Examples are disclosed relating to foldable display devices and methods for folding a display device through a range of degrees at a folding portion. In one example, a display device comprises a rear cover and a cover glass layer extending from a left side of the display device through the folding portion to a right side. A light-emitting layer is between the rear cover and the cover glass layer. A backplate is between the rear cover and the light-emitting layer, with the backplate comprising backplate slots that extend from an upper surface through a lower surface to facilitate bending of the backplate.

19 Claims, 26 Drawing Sheets

(56) References Cited

U.S. PATENT DOCUMENTS

| | | | |
|---|---|---|---|
| 2016/0357052 A1 | 12/2016 | Kim et al. | |
| 2018/0217639 A1 | 8/2018 | Jones et al. | |
| 2019/0302850 A1* | 10/2019 | Park | H04M 1/0268 |
| 2020/0292731 A1 | 9/2020 | Park et al. | |
| 2020/0319672 A1 | 10/2020 | Kim et al. | |
| 2020/0342789 A1 | 10/2020 | Park et al. | |
| 2021/0192984 A1* | 6/2021 | Yoo | G06F 1/1652 |
| 2021/0385959 A1 | 12/2021 | Wang | |

FOREIGN PATENT DOCUMENTS

| | | |
|---|---|---|
| WO | 2020142363 A1 | 7/2020 |
| WO | 2020155736 A1 | 8/2020 |

OTHER PUBLICATIONS

"International Search Report & Written Opinion Issued in PCT Application No. PCT/US21/053448", Mailed Date : Jan. 31, 2022, 12 Pages.

Communication 71(3) Received for European Application No. 21798899.7, mailed on Apr. 1, 2025, 2024, 7 pages.

* cited by examiner

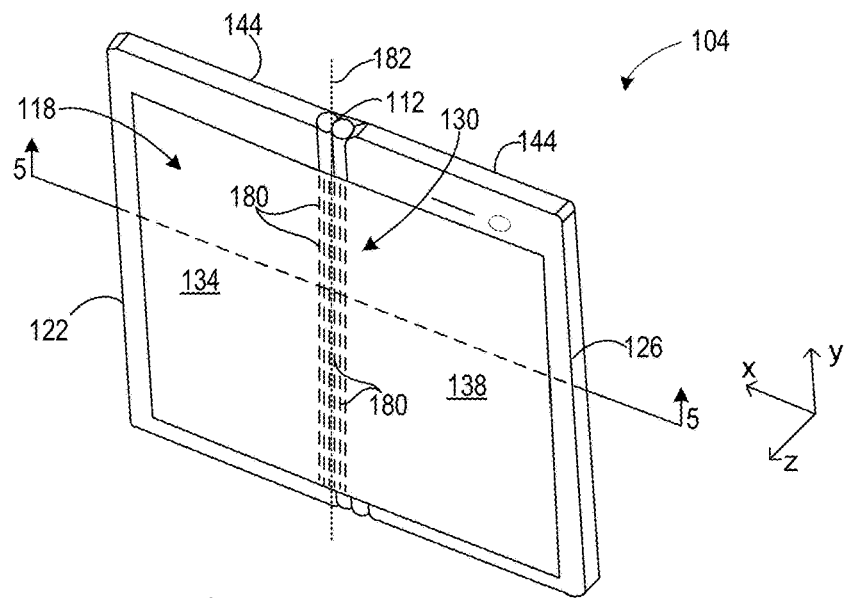
FIG. 1A
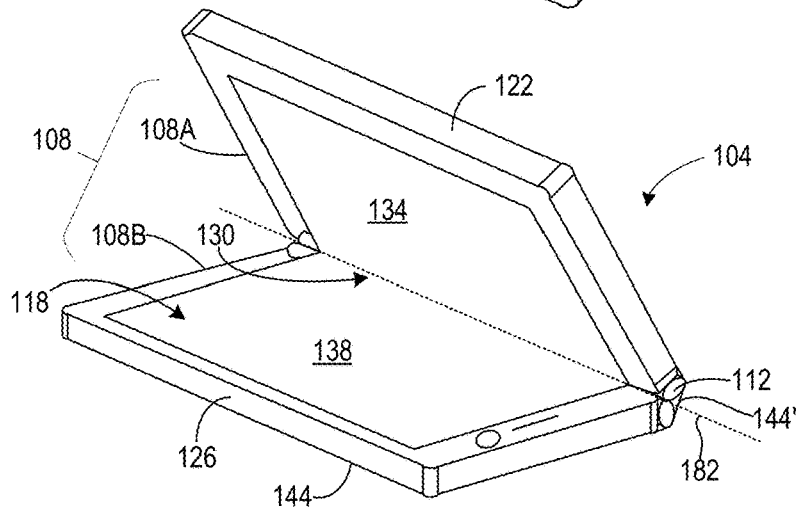
FIG. 1B
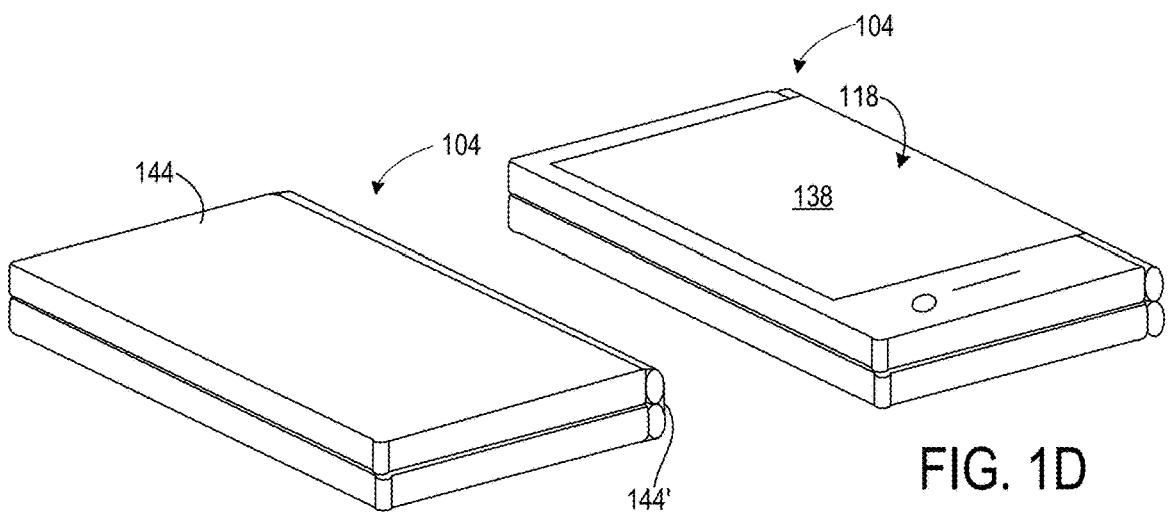
FIG. 1C
FIG. 1D

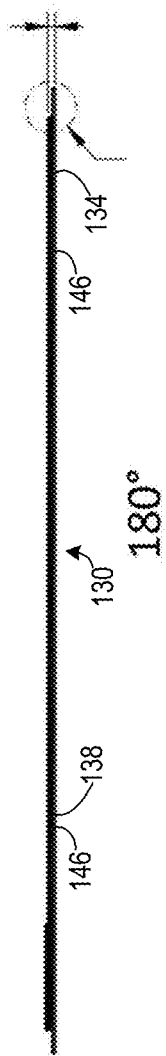
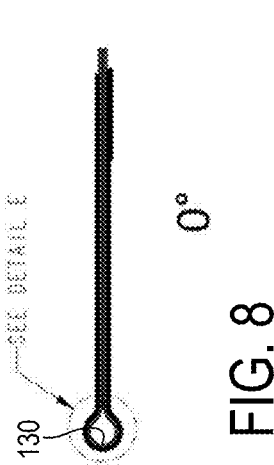
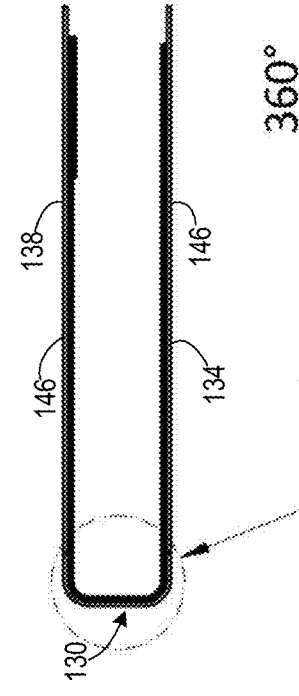
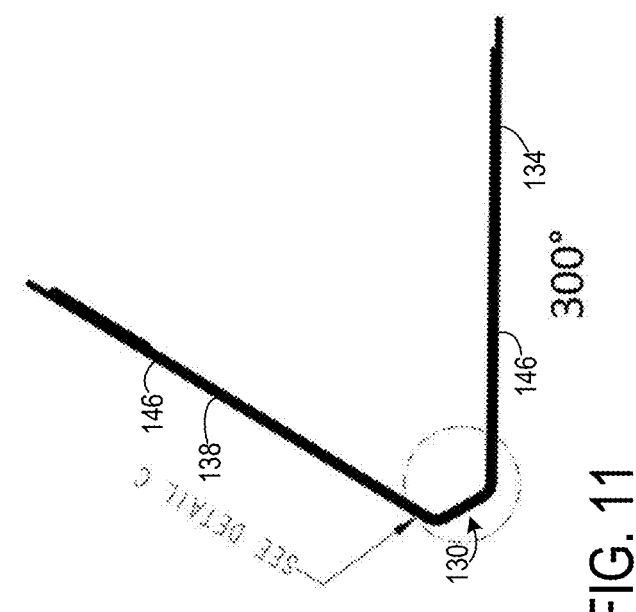
FIG. 8
FIG. 10
FIG. 11
FIG. 12

FOLDABLE DISPLAY DEVICE WITH BACKPLATE SLOTS

CROSS REFERENCE TO RELATED APPLICATIONS

This application claims priority to U.S. Provisional Patent Application Ser. No. 63/113,776, filed Nov. 13, 2020, the entirety of which is hereby incorporated herein by reference for all purposes.

BACKGROUND

Some computing devices utilize a flexible glass display material that may be folded to create different viewing orientations. However, such devices can exhibit visible creases and other visual artifacts at the folding locations of the display.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to foldable display devices and methods for folding a display device through a range of degrees. In one example, a display device foldable through 360 degrees at a folding portion comprises a rear cover and a cover glass layer extending from a left side of the display device through the folding portion to a right side of the display device. A light-emitting layer is disposed between the rear cover and the cover glass layer. A backplate is positioned between the rear cover and the light-emitting layer, with the backplate comprising a plurality of backplate slots that each extend from an upper surface of the backplate through a lower surface of the backplate to facilitate bending of the backplate.

In another example, a display device foldable through a range of degrees at a folding portion comprises a rear cover and a cover glass layer extending from a left side of the display device through the folding portion to a right side of the display device. A light-emitting layer is disposed between the rear cover and the cover glass layer. The cover glass layer comprises a plurality of cover glass layer slots in the folding portion to facilitate folding of the cover glass layer. A backplate is positioned between the rear cover and the light-emitting layer, with the backplate comprising a plurality of backplate slots that each extend from an upper surface of the backplate through a lower surface of the backplate to facilitate bending of the backplate.

In another example, a method for folding a display device through a range of degrees at a folding portion comprises providing the display device, with the display device comprising a rear cover and a cover glass layer extending from a left side of the display device through the folding portion to a right side of the display device. The cover glass layer comprises a left portion between the left side and the folding portion and a right portion between the right side and the folding portion. A light-emitting layer is disposed between the rear cover and the cover glass layer. A backplate is positioned between the rear cover and the light-emitting layer, with the backplate comprising a plurality of backplate slots to facilitate bending of the backplate.

The method includes folding at least the cover glass layer at the folding portion and the backplate at the backplate slots in a first rotational direction until the left portion of the cover glass layer is facing and parallel to the right portion of the cover glass layer. The method also includes folding at least the cover glass layer at the folding portion and the backplate at the backplate slots in a second rotational direction opposite to the first rotational direction until the left portion of the cover glass layer is parallel to and facing away from the right portion of the cover glass layer.

BRIEF DESCRIPTION OF THE DRAWINGS

FIGS. 1A-1D show an example of a foldable display device according to examples of the present disclosure.

FIG. 8 shows a simplified illustration of the cover glass layer of the display device of FIG. 1A in a zero degree orientation according to examples of the present disclosure.

FIG. 10 shows a simplified illustration of the cover glass layer of the display device of FIG. 1A in a 180 degree orientation according to examples of the present disclosure.

FIG. 11 shows a simplified illustration of the cover glass layer of the display device of FIG. 1A in a 300 degree orientation according to examples of the present disclosure.

FIG. 12 shows a simplified illustration of the cover glass layer of the display device of FIG. 1A in a 360 degree orientation according to examples of the present disclosure.

DETAILED DESCRIPTION

Figure 2:
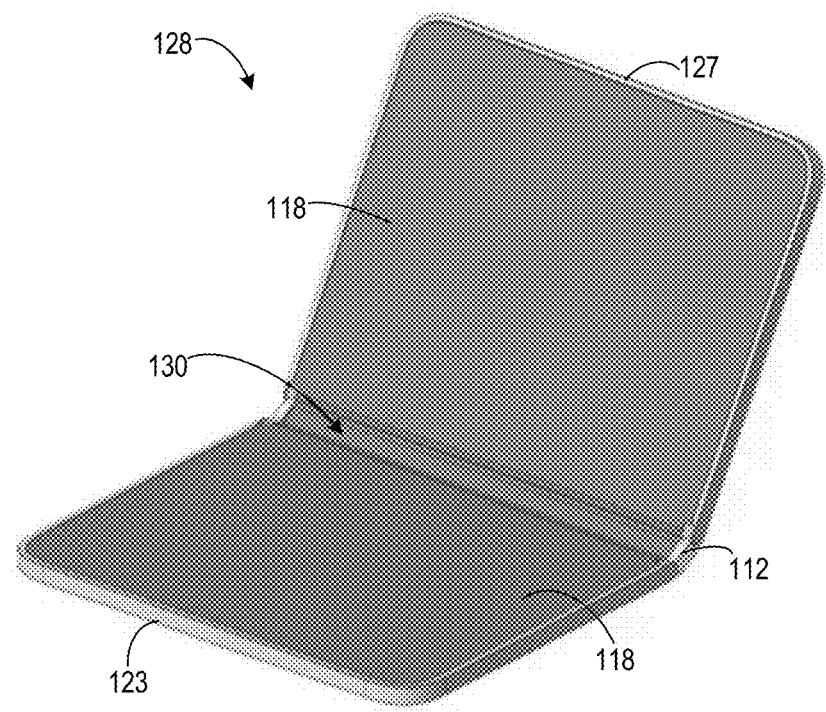
FIGS. 2 and 3 show another example of a foldable display device according to the according to examples of the present disclosure.

Some computing devices utilize a flexible glass display material that can be folded to create different viewing orientations. For example, some displays may utilize an ultra-thin glass layer with a plastic film. However, such devices can exhibit visible mechanical creases, wrinkles, and other visual artifacts at the folding locations of the display. Additionally, ultra-thin glass displays may be more susceptible to cracking and other physical damage. Further, other components such as supporting backplates can inhibit bi-directional folding of such displays.

Accordingly, examples are disclosed relating to display devices and related methods that utilize configurations of foldable glass with a backplate comprising backplate slots that facilitate folding while avoiding mechanical creases at the folding portion. The present examples also provide a consistent transparency and light transmission across the display including the folding portion, along with mechanically robust components. In this manner, display devices of the present disclosure can freely rotate through various angles and orientations while also exhibiting substantially uniform and smooth surfaces in various folded and flat orientations to provide a pleasing and high quality appearance and feel to a user.

With reference now to FIGS. 1A-1D, one example of a display device 104 is illustrated in the form of a foldable mobile computing device. In other examples, the display device may take the form of a laptop computing device, tablet computing device, or any other suitable computing device. In the example of FIGS. 1A-1D, the display device 104 includes a housing 108 having a first part 108A and a second part 108B coupled by a hinge 112. As described in more detail below, in this example a cover glass layer 118 extends over the first part 108A and second part 108B of housing 108, and is foldable at a folding portion 130 adjacent to the hinge 112. Additionally and with reference also to FIG. 5, a backplate 176 beneath the cover glass layer 118 includes a plurality of backplate slots 180 (indicated by dotted lines in FIG. 1A) to facilitate bending of the backplate.

In the example of FIGS. 1A-1D, the first part 108A and a second part 108B are movable relative to each other. The hinge 112 is configured to permit the first part 108A and second part 108B to rotate through a range of degrees relative to one another. In this example, the hinge 112 enables the first part 108A and second part 108B to rotate 360 degrees to any relative angular orientation between a face-to-face orientation of zero degrees (FIG. 1C) and a back-to-back orientation of 360 degrees (FIG. 1D). In other examples, the first part 108A and the second part 108B are rotatable about hinge 112 to an extent less than 360 degrees.

As described in more detail below, the cover glass layer 118 extends from a left side 122 of the display device 104 through a folding portion 130 to a right side 126 of the display device. In this example, the folding portion 130 of the cover glass layer 118 is located midway between the left side 122 and the right side 126 of the display device. The terms "left" and "right" are used merely for descriptive purposes, and any other pair of terms denoting opposing locations, such as "up" and "down," may be utilized and are within the scope of the present disclosure. In the example of FIGS. 1A-1D, a bezel is between the left side of the cover glass layer 118 and the left side 122 of the display device, and between the right side of the cover glass layer 118 and the right side 126 of the display device. In other examples, the cover glass layer 118 extends to be substantially flush with the left side 122 and/or the right side 126 of the display device.

Figure 3:
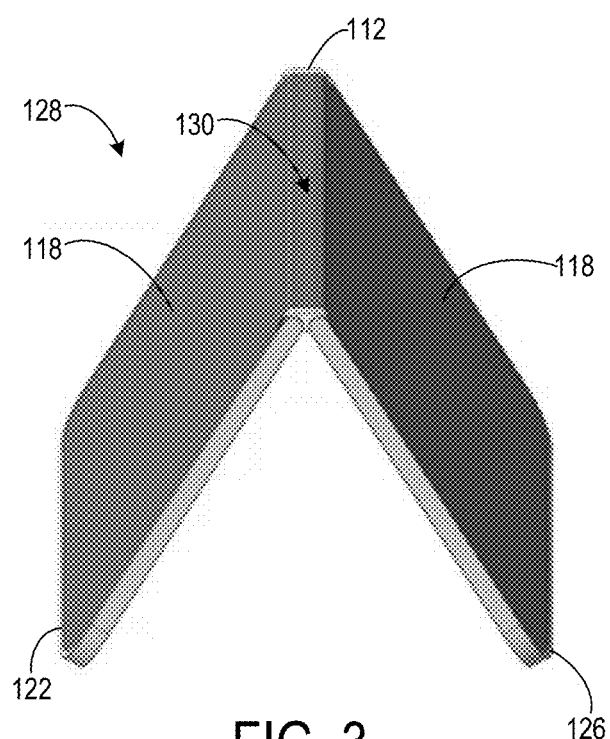

With reference to FIGS. 2 and 3, another example of a display device 128 according to the present disclosure is illustrated. In this example, cover glass layer 118 extends from the left side 123 through folding portion 130 to the right side 126 of the device 128. Hinge 112 enables the cover glass layer 118 to be folded through a range of degrees at folding portion 130.

With reference again to the example shown in FIGS. 1A-1D, the cover glass layer 118 includes a left portion 134 between the left side 122 and the folding portion 130 and a right portion 138 between the right side 126 and the folding portion. As described further below, the cover glass layer 118 is a continuous glass layer that can be folded at the folding portion 130.

Figure 4:
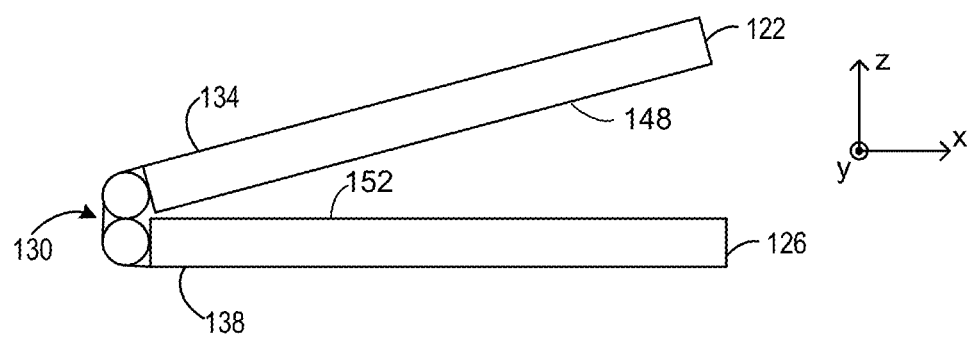
FIG. 4 shows a top end view of the display device of FIGS. 1A-1D according to examples of the present disclosure.

The housing 108 includes a rear cover 144 that extends over the folding portion 130 of the cover glass layer 118 as shown in FIG. 1A. In the example of FIGS. 1A-1D, the rear cover 144 is a single-piece rear cover that comprises a stretchable material at least in an expandable area 144' located adjacent to the hinge 112. In this manner, the rear cover may expand and contract as the display device is rotated through different angles and orientations. In other examples and with reference to FIG. 4, a display device according to the present disclosure includes a left rear cover 148 located opposite to the left portion 134 of the cover glass layer 118, and a separate right rear cover 152 located opposite to the right portion 138 of the cover glass layer. In this example, the left rear cover 148 and right rear cover 152 are separate components coupled via the hinge 112.

Figure 5:
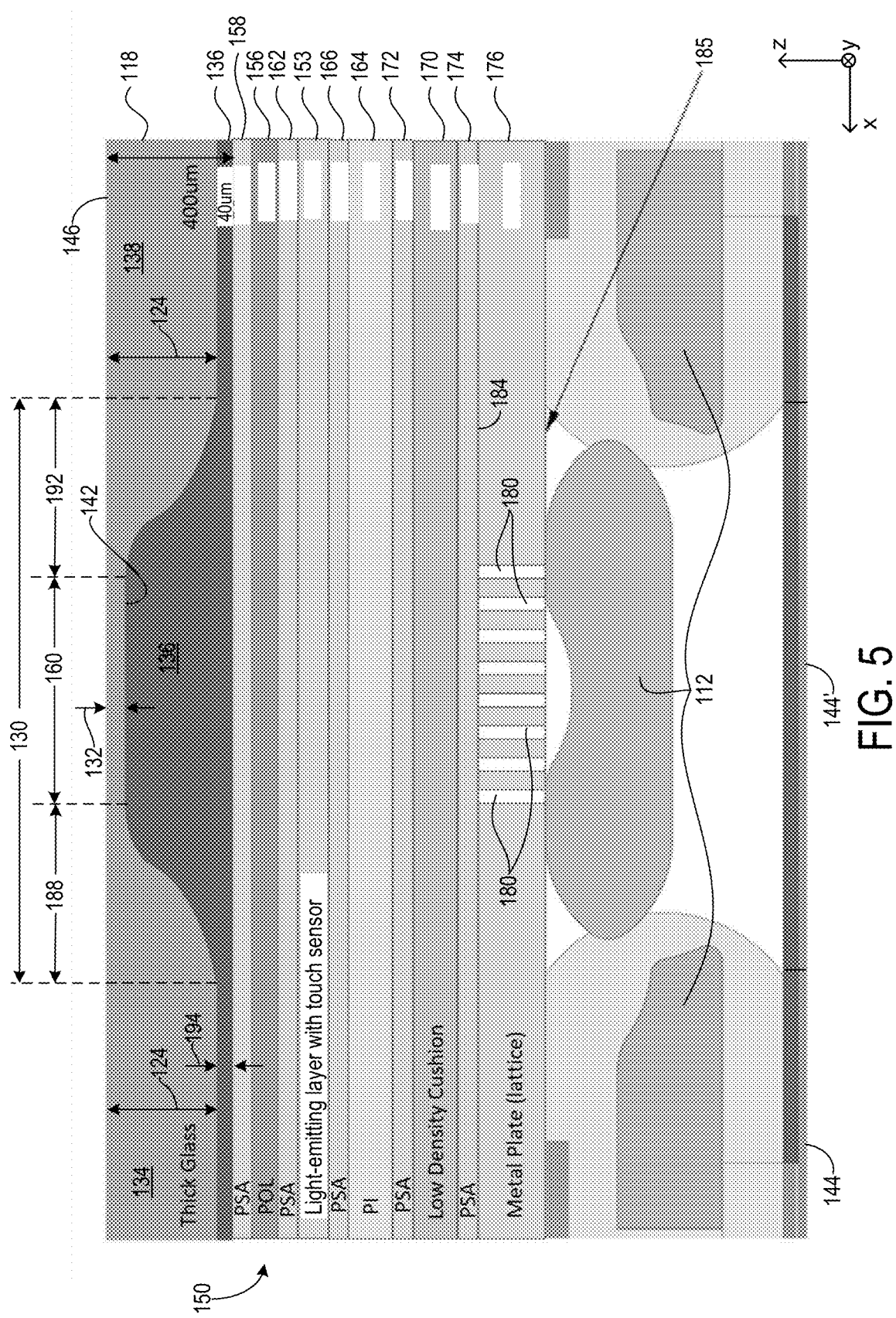
FIG. 5 shows a partial schematic cross section of the display device of FIG. 1A taken through section line 5-5 according to examples of the present disclosure.

With reference now to FIG. 5, a partial schematic cross section of display device 104 taken through section line 5-5 in FIG. 1A is shown. As noted above and described in more detail below, a second backplate 176 between rear cover 144 and a light-emitting layer 153 includes a plurality of backplate slots 180 that each extend from an upper surface 184 of the second backplate through a lower surface 185 of the second backplate to facilitate bending of the backplate. As described in more detail below, in this example the cover glass layer 118 has a first thickness 124 outside the folding portion 130 and a second thickness 132 within the folding portion, wherein the second thickness within the folding portion is less than the first thickness outside the folding portion to facilitate folding of the cover glass layer. Additionally, in this example a polymer layer 136 is located adjacent to an interior surface 142 of the cover glass layer 118 and fills the space between the interior surface and the pressure sensitive adhesive (PSA) layer 158 described further below. Advantageously, the polymer layer 136 has a polymer transmittance substantially equal to a glass transmittance of the cover glass layer 118. In this manner, the display device 104 provides a consistent transparency across the entire cover glass layer 118 including in the folding portion 130. Additionally, in this configuration of the cover glass layer 118, the outer surface 146 of the cover glass layer exhibits a substantially uniform and smooth surface in various folded and flat orientations of the device, including at the 180 degree orientations as shown in FIG. 5, to thereby provide a pleasing, high quality appearance and tactile feel to a user.

In the example display device of FIG. 5, a touch display module 150 includes a light-emitting layer 153 with touch sensing functionality. In one example, the light-emitting layer 153 comprises an organic light-emitting diode (OLED) panel bonded to a capacitive touch sensor layer (not shown). In other examples, other suitable display technologies and/or touch sensing technologies may be utilized. In some examples, a display device of the present disclosure may utilize a light emitting layer 153 that does not include touch sensing functionality.

As shown in the example of FIG. 5, the light emitting layer 153 is positioned between the rear cover 144 and the cover glass layer 118. The polymer layer 136 below the cover glass layer 118 is bonded to a polarizing layer 156 with a first optically clear pressure sensitive adhesive (PSA) layer 158. The polarizing layer 156 is bonding to the light-emitting layer 153 with a second PSA layer 162. A first backplate (PI) 164 is located below and bonded to the light-emitting layer 153 with a third PSA layer 166. In one example the first backplate 164 comprises a polymeric material, such as polyimide, to provide structural support to the OLED display panel in light-emitting layer 153. In other examples, other suitable backplate materials, such as polyethylene terephthalate (PET) and polyether block amide (PEBA), may be utilized.

The first backplate 164 is bonded to a cushion layer 170 with a fourth PSA layer 172. The cushion layer 170 can comprise any suitable low density material, such as a polyurethane or thermoplastic polyurethane material, or other stretchable/deformable foam to absorb external mechanical impacts and deformations. The cushion layer 170 is bonded to the second backplate 176 via a fifth PSA layer 174. In this example, the second backplate 176 comprises a metal plate. In other examples, the second backplate 176 may comprise a metal film layer. The second backplate 176 supports the components of the touch display module 150 and provides a physical interface with components of the hinge 112 as the display device and touch display module 150 are rotated through various angles.

Additionally, and as schematically shown in FIG. 5, the second backplate 176 comprises a plurality of backplate slots 180 that each extend from an upper surface 184 of the second backplate through an opposing lower surface 185 toward the rear cover 144. As described in more detail below, and in one potential advantage of the present disclosure, the backplate slots 180 are positioned opposite to the folding portion 130 of the cover glass layer 118 to facilitate bending of the second backplate 176 when the display device is rotated through various angles and orientations. In this manner, the backplate slots 180 are configured to enable the bi-directional folding of the display device while also enabling the second backplate 176 to provide structural support to the display components of the device.

Figure 6:
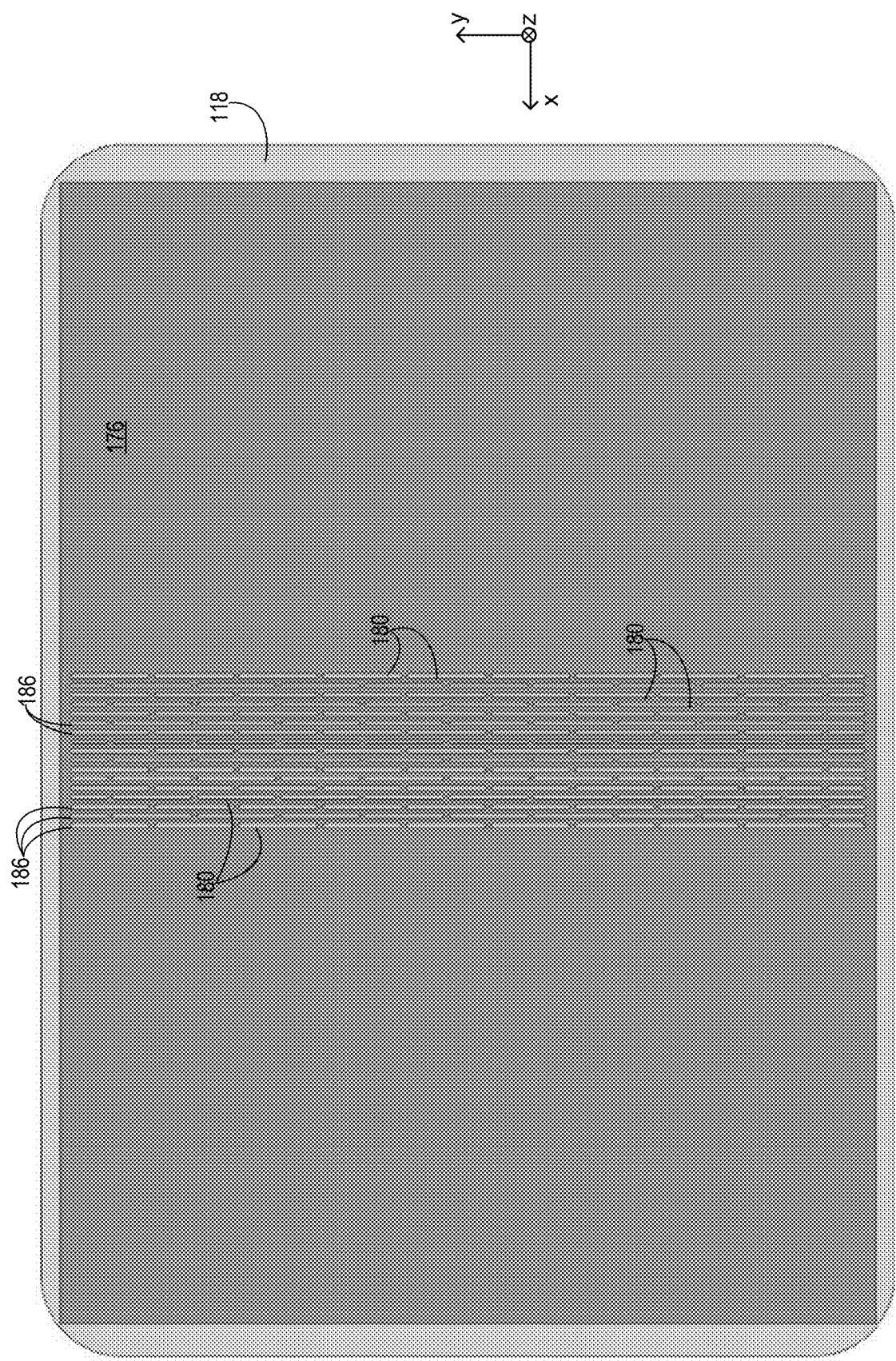
FIG. 6 shows a backplate of the display device of FIGS. 1A-1D according to examples of the present disclosure.

FIG. 6 shows a view of the second backplate 176 and the plurality of backplate slots 180 forming a two-dimensional lattice of slots. As illustrated in this figure and with reference also to FIGS. 1A and 1B, each of the backplate slots 180 comprises a longitudinal axis that extends in the y-axis direction parallel to a folding axis 182 about which the display device folds. Advantageously, arranging the longitudinal axes of the backplate slots 180 to be parallel to the folding axis 182 provides flexibility to the second backplate 176 about this folding axis. Additionally, the backplate slots 180 are arranged in a plurality of rows 186 that each extend in the y-axis direction parallel to the folding axis 182. As shown in FIG. 6, the backplate slots 180 in each row 186 are shifted in the y-axis direction with respect to the backplate slots 180 in each adjacent row. Alternatively expressed, each backplate slot 180 in a first row is offset along the folding axis 182 with respect to each backplate slot in a second row adjacent to the first row.

With this configuration, and in one potential advantage of the present disclosure, the backplate slots 180 provide pliability to the second backplate 176 to enable the second backplate to freely rotate about the folding axis 182 when the display device 104 is rotated through various angles and orientations.

With reference also to FIGS. 1A-1D, each of the components and layers shown in FIG. 5 and described above may extend across the display device 104 between the left side 122 and the right side 126. In some examples these layers and components may be continuous with the cover glass layer 118 and share a common rectangular footprint with the cover glass layer. In other examples, the one or more of the layers and components may have a footprint in the x-y axis that differs from the footprint of the cover glass layer 118. Each of the layers may have any suitable thickness, and such thicknesses may vary to accommodate different display device requirements and design considerations, such as form factors, component types, and other considerations.

Figure 7:
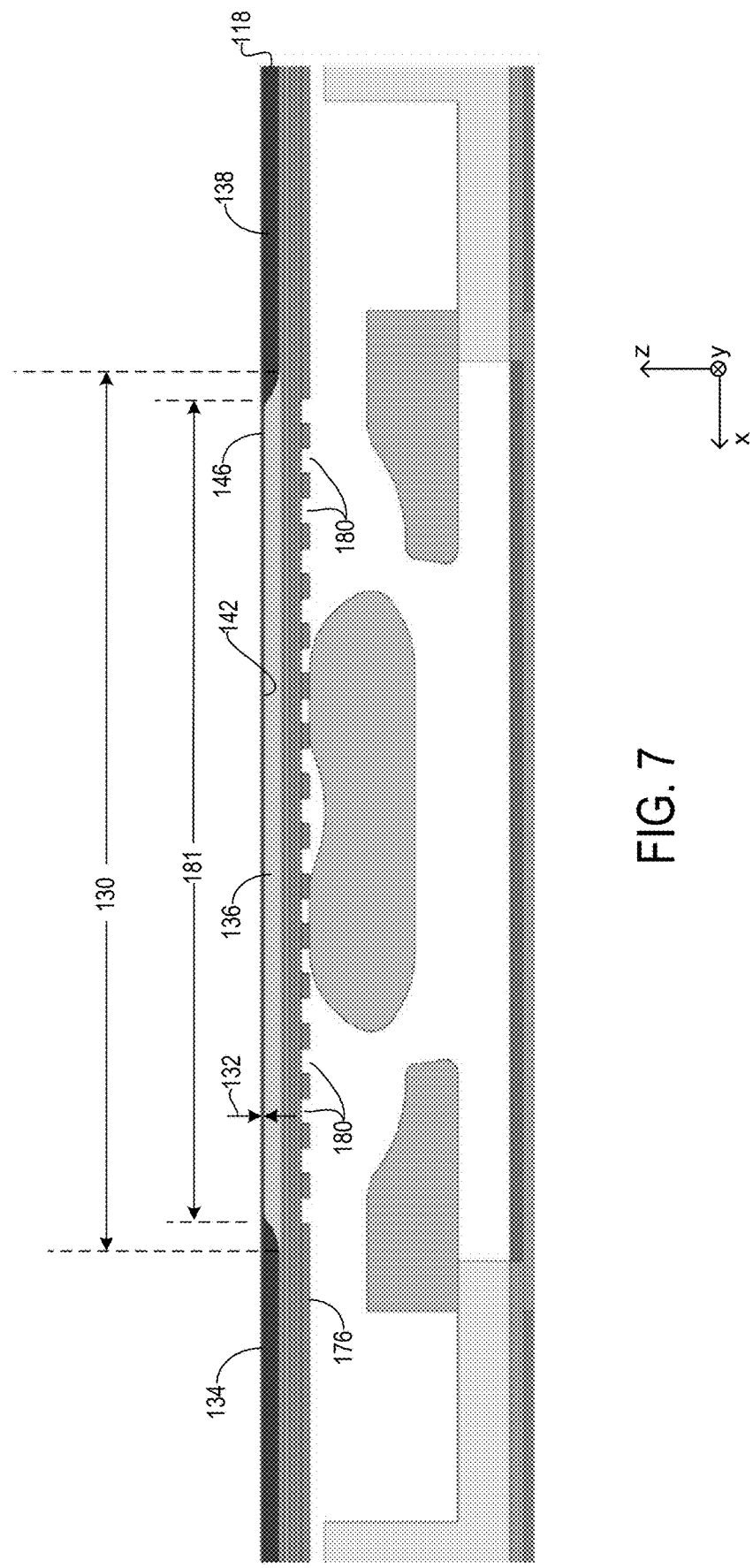
FIG. 7 shows another representation of a partial schematic cross section of the display device of FIG. 1A taken through section line 5-5 according to examples of the present disclosure.

FIG. 7 shows another representation of a partial cross section of display device 104 taken through section line 5-5 in FIG. 1A. The components and layers in FIG. 7 are the same as the components and layers in FIG. 5. In this example, a first width 181 of the plurality of backplate slots is less than a second width of the folding portion 130. With this configuration, in some examples the radius of curvature of the cover glass layer 118 may be reduced as the cover glass layer is rotated through various angles. As described further below, in other examples a width of the plurality of backplate slots is substantially equal to or greater than the width of the folding portion 130. In these examples, the radius of curvature of the cover glass layer 118 may be increased as the cover glass layer is rotated through various angles. Additionally, and with reference again to FIG. 1A, in this example the backplate slots 180 are located midway between the left side 122 and the right side 126 of the display device 104.

As noted above with respect to the example of FIG. 5, and in one potential advantage of the present disclosure, the cover glass layer 118 has a first thickness 124 outside the folding portion 130 and a second thickness 132 within the folding portion, wherein the second thickness within the folding portion is less than the first thickness outside the folding portion to facilitate folding of the cover glass layer. In this example, the folding portion 130 of the cover glass layer 118 includes a thinned portion 160 centered in the folding portion. The thinned portion 160 is joined by a left transition portion (indicated at 188) to the left thick portion 134 of the cover glass layer 118. Similarly, the thinned portion 160 is joined by a right transition portion (indicated at 192) to the right thick portion 138 of the cover glass layer 118.

In the present example, the thinned portion 160 of cover glass layer 118 has a second thickness 132 of approximately 35 microns. In other examples, the thinned portion 160 has a second thickness of between approximately 30 microns and approximately 40 microns. Also in the present example, the first thickness 124 of the left thick portion 134 and right thick portion 138 of the cover glass layer 118 is approximately 360 microns. The thickness 194 of the polymer layer 136 adjacent to these thick portions is approximately 40 microns, which yields a combined thick glass/polymer layer thickness of approximately 400 microns. In other examples, the thickness 194 of the polymer layer 136 adjacent the thick portions is between approximately 25 microns and approximately 50 microns. In some examples, the first thickness 124 of the left thick portion 134 and right thick portion 138 is between approximately 350 microns and approximately 450 microns.

As noted above and shown in the example of FIG. 5, the folding portion 130 of the cover glass layer 118 includes a thinned portion 160 that is joined by a left transition portion 188 to the left thick portion 134 of the cover glass layer 118, and by a right transition portion 192 to the right thick portion 138 of the cover glass layer 118. The transition portions 188, 192 are configured to provide a gradual arcuate tapering and profile change between the opposing thick portions 134, 138 and the thinned portion 160 of the cover glass layer 118. In this manner and as described in more detail below, this gradual tapering profile reduces undesirable visual indications of these transition portions, such as shadows or other visible artifacts, particularly when the display device 104 is in a 180 degree orientation as shown in FIGS. 5 and 7.

The transition portions 188, 192 and thinned portion 160 may be formed in cover glass layer 118 in any suitable manner. In one example, these portions may be fabricated by processing cover glass 118 with laser modification and wet etching techniques. In some examples, the folding portion 130 is irradiated with a laser to define an area for wet etching processing. Material is removed from the cover glass layer 118 within the folding portion 130 via wet etching to form the transition portions 188, 192 and the desired thickness 132 of the thinned portion 160.

As described in more detail below, this configuration of folding portion 130 including thinned portion 160 in between left and right thick portions 134, 138 enables the display device 104 to be rotated through 360 degrees while also preventing undesirable mechanical creases and visual artifacts at the folding portion. Additionally, by providing the left thick portion 134 and right thick portion 138 of cover glass layer 118 on either side of the thinned portion 160, the majority of the cover glass overlying the touch display module 150 is thicker, such as 360 microns. Advantageously, providing such a thicker layer of cover glass over a majority of the touch display module 150, the present configuration also operates to suppress internal deformations in components of the touch display module and further inhibits formation of mechanical creases at the folding portion.

Figure 15:
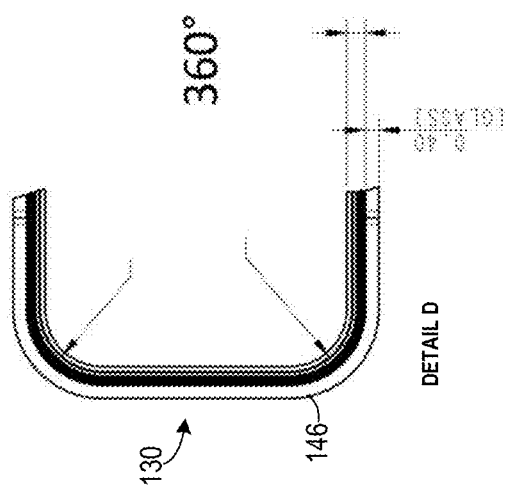
FIG. 15 shows a simplified illustration of the folding portion of the cover glass layer at the 360 degree orientation according to examples of the present disclosure.
Figure 13:
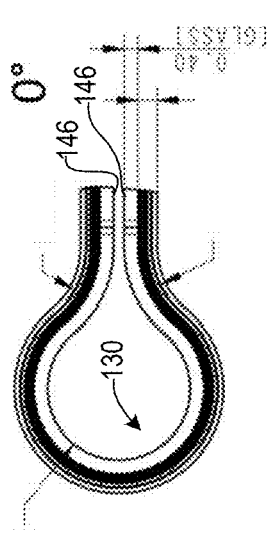
FIG. 13 shows a simplified illustration of the folding portion of the cover glass layer at the zero degree orientation according to examples of the present disclosure.
Figure 16:
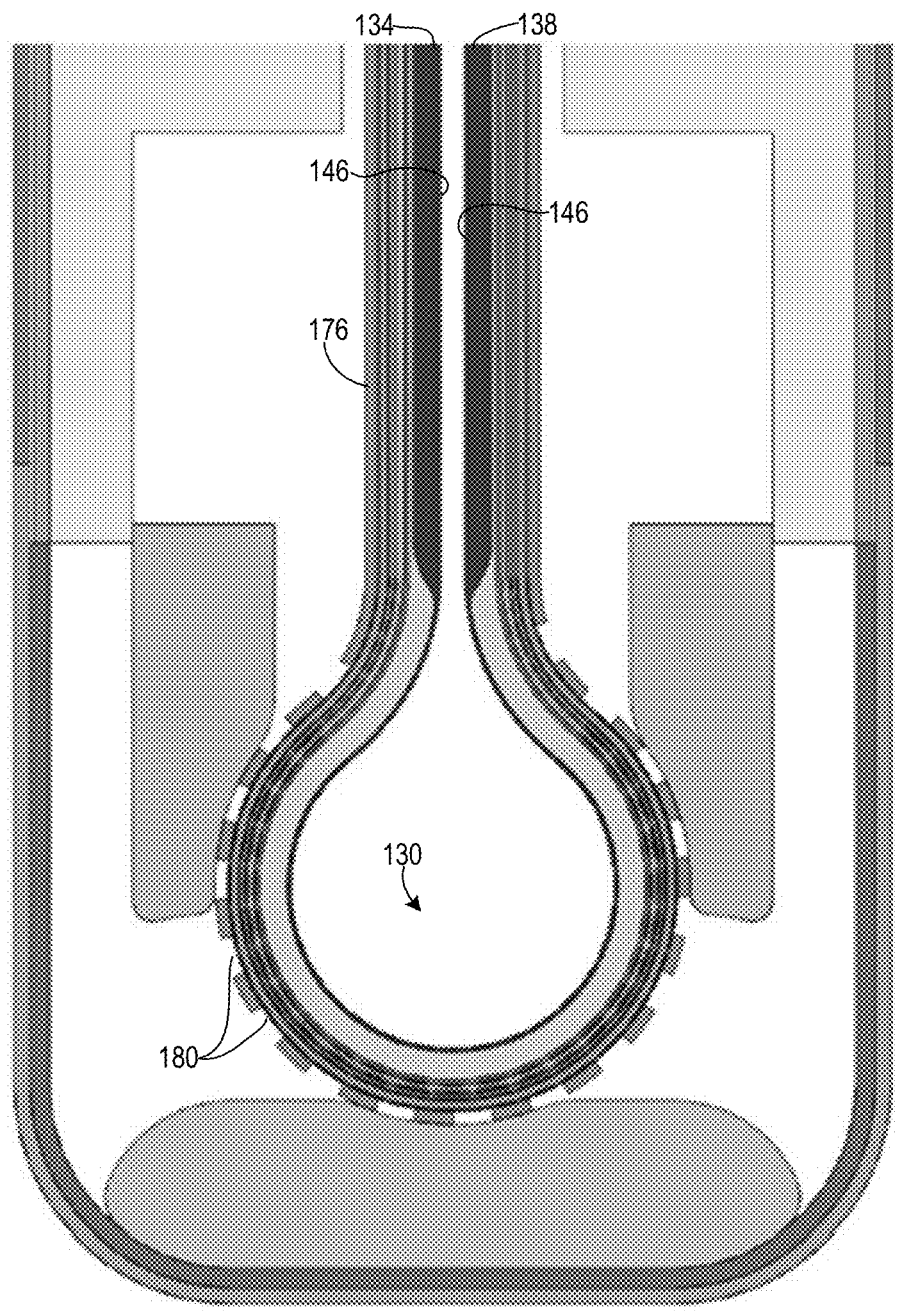
FIG. 16 shows another simplified illustration of the folding portion of the cover glass layer at the zero degree orientation according to examples of the present disclosure.

With reference also to FIGS. 8-18 (not to scale), this configuration of folding portion 130 including thinned portion 160 in between left and right thick portions 134, 138 enables the display device 104 to be rotated through 360 degrees by creating deformation profiles at the folding portion 130 as shown in these figures. As shown in FIGS. 8, 13 and 16 (and 1C), at a zero degrees orientation the outer surface 146 of the cover glass layer 118 is in a face-to-face orientation. In this orientation, the folding portion 130 forms a circular deformation profile that transitions into a planer configuration in which the left thick portion 134 of the cover glass layer 118 is parallel to and facing the right thick portion 138. Advantageously, this circular deformation profile enables a significant portion of the folding portion 130 to be uniformly distributed around the circular shape to minimize visual discontinuities within the profile. FIG. 13 shows one example implementation of this configuration.

Figure 9:
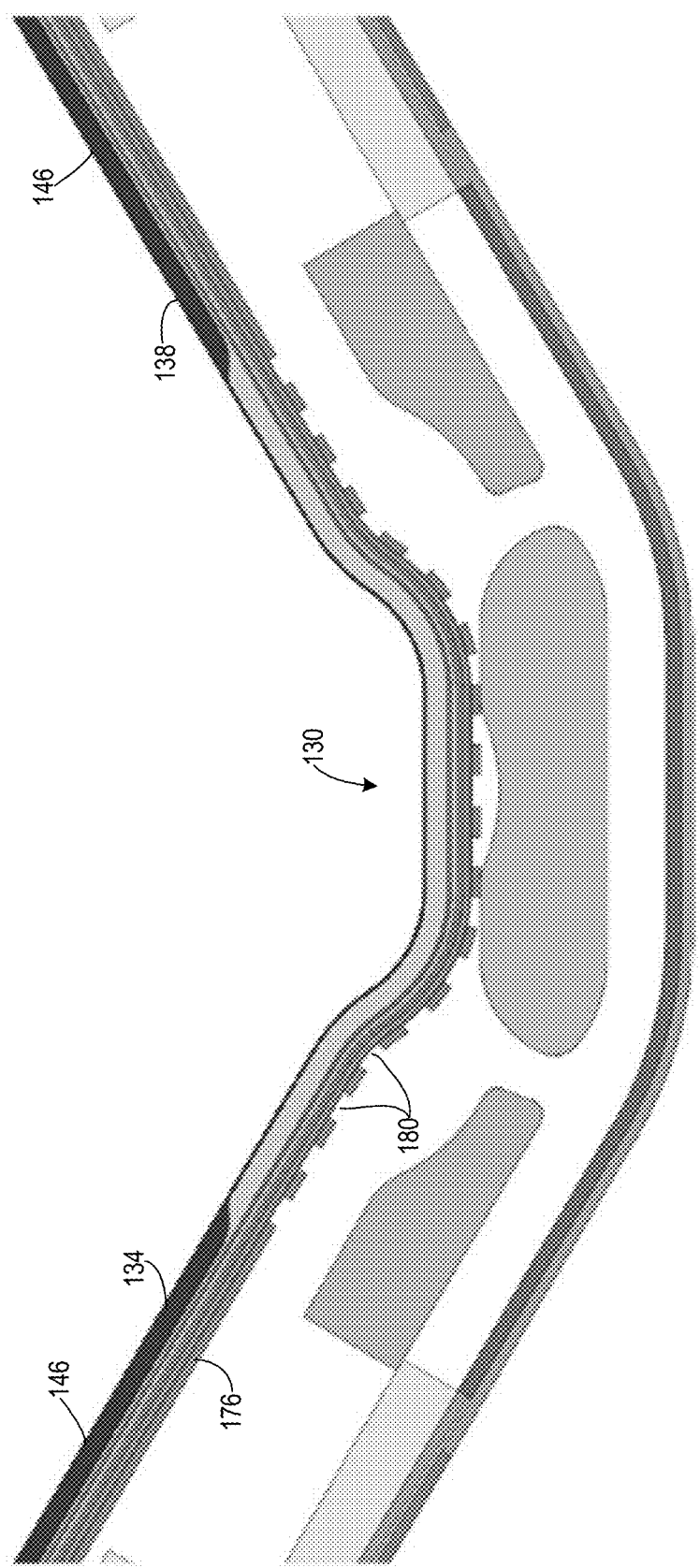
FIG. 9 shows a simplified illustration of the display device of FIG. 1A in a 120 degree orientation according to examples of the present disclosure.

FIG. 9 shows cover glass layer 118 in a 120 degree orientation with outer surface 146 of cover glass layer 118 facing upwardly. FIG. 10 shows another view of display device 104 in a 180 degree orientation with outer surface 146 of cover glass layer 118 facing downwardly. As noted above and depicted in this figure, in one potential advantage of the configurations of the present disclosure, the outer surface 146 of the cover glass layer 118 is substantially planar through the folding portion 130 when the display device is in a 180 degree orientation.

Figure 14:
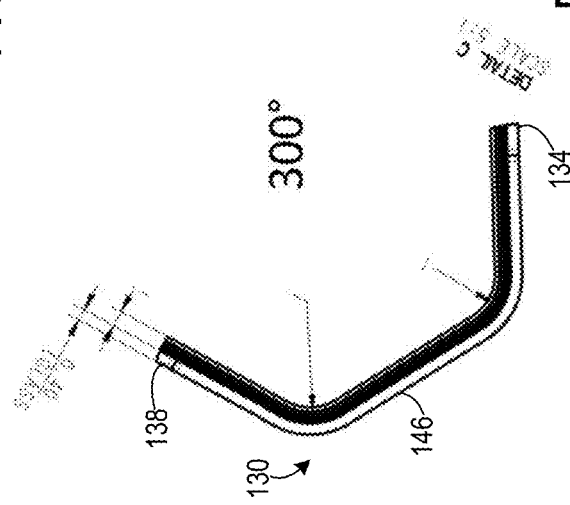
FIG. 14 shows a simplified illustration of the folding portion of the cover glass layer at the 300 degree orientation according to examples of the present disclosure.
Figure 17:
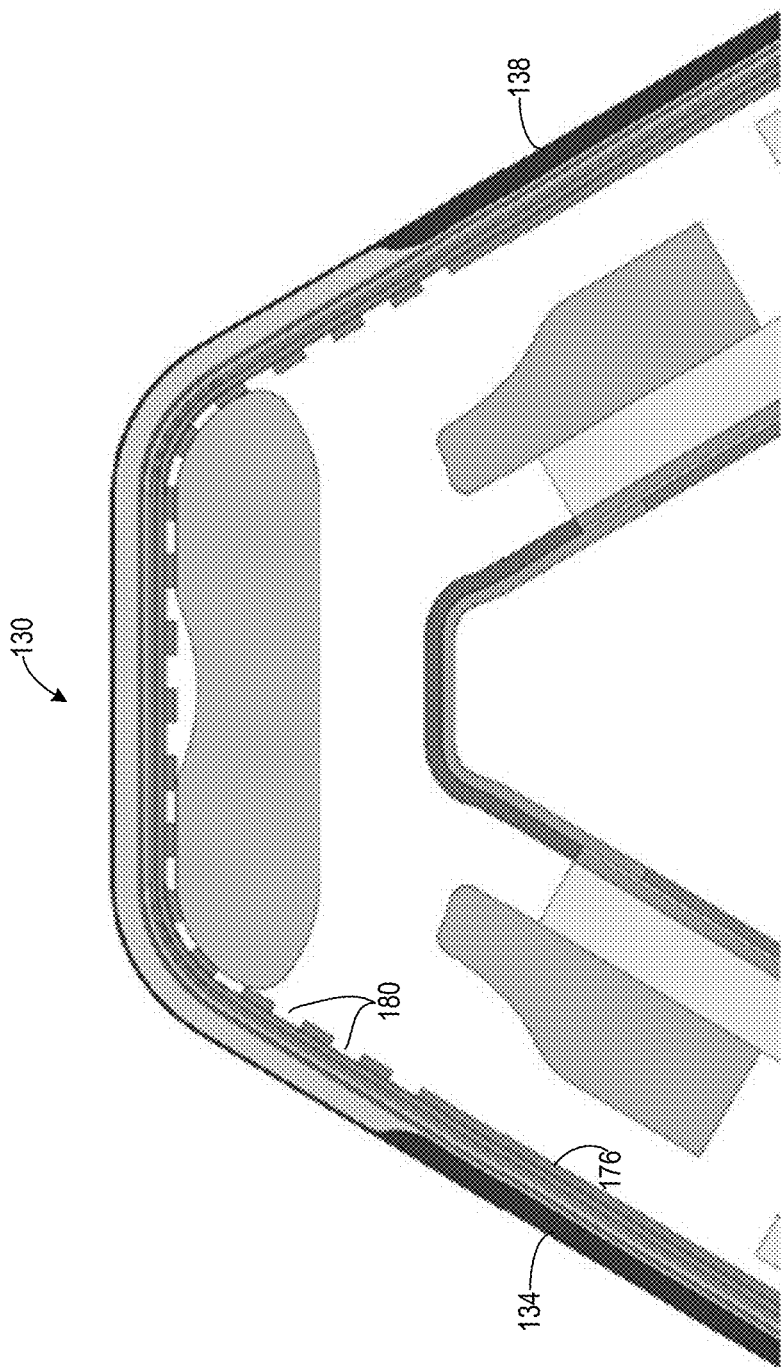
FIG. 17 shows another simplified illustration of the folding portion of the cover glass layer at the 300 degree orientation according to examples of the present disclosure.

FIGS. 11, 14, and 17 show the cover glass layer 118 in a 300 degree orientation, where from the 180 degree orientation of FIG. 10 the right thick portion 138 is rotated upwardly about folding portion 130. FIG. 14 shows one example implementation of this configuration, in which the folding portion 130 bends about two radii that cause right thick portion 138 and left thick portion 134 of cover glass layer 118 to form the 300 degree angle.

Figure 18:
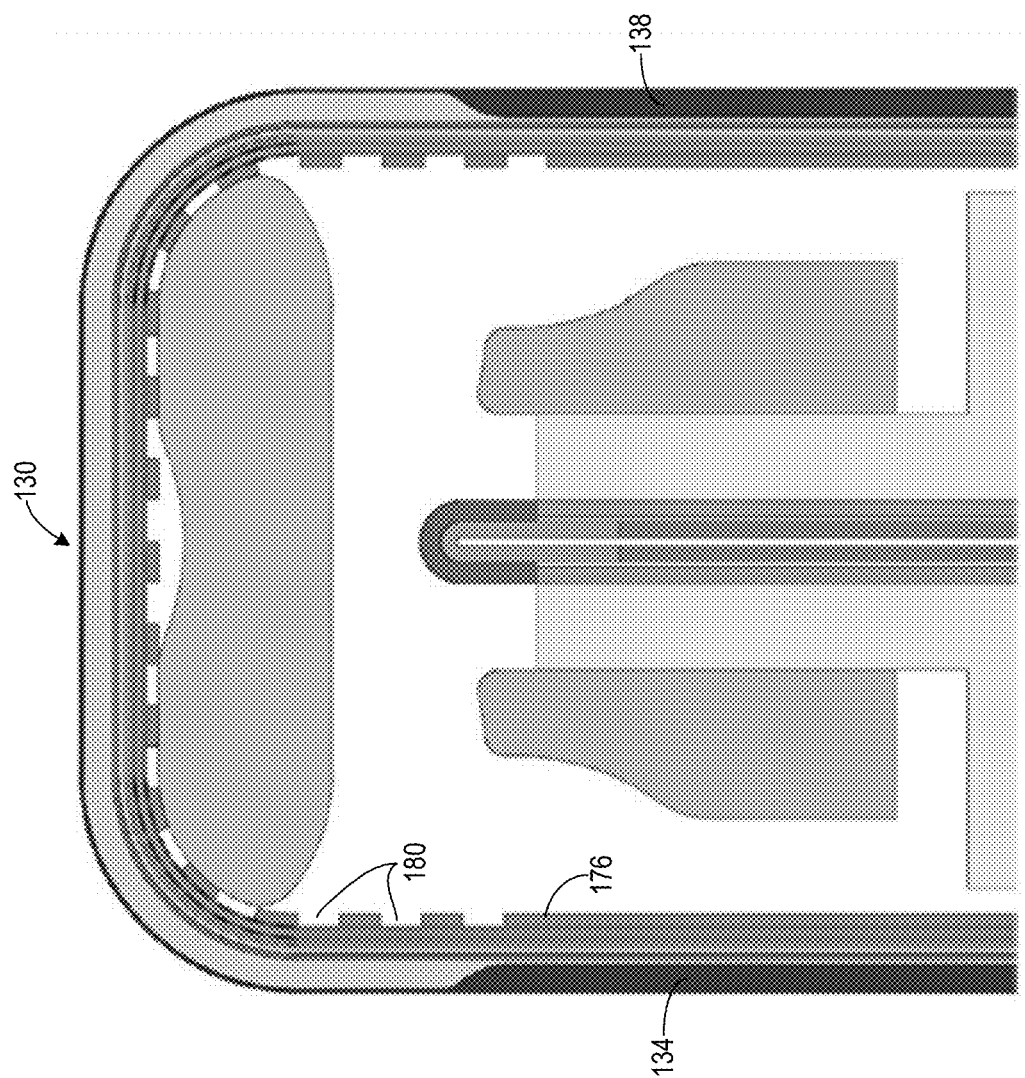
FIG. 18 shows another simplified illustration of the folding portion of the cover glass layer at the 360 degree orientation according to examples of the present disclosure.

FIGS. 12, 15, and 18 (and FIG. 1D) shown the cover glass layer 118 and display device 104 in a 360 degree orientation, where the outer surface 146 of cover glass layer is in a back-to-back orientation with left thick portion 134 of the cover glass layer 118 facing in a direction opposite to the right thick portion 138. As shown in these figures, in this orientation the cover glass layer forms a right-angled U-shape deformation profile that transitions into a planer configuration in which the left thick portion 134 of the cover glass layer 118 is parallel to and facing in a direction opposite to the right thick portion 138. Advantageously, this U-shaped deformation profile distributes internal stresses evenly across two curved portions of the folding portion 130. FIG. 14 shows one example implementation of this configuration.

With reference again to FIGS. 5 and 7 and as noted above, polymer layer 136 is located adjacent to an interior surface 142 of the cover glass layer 118. In this example, the polymer layer 136 has an upper profile that is a mirror image of a lower profile of the interior surface 142 of the cover glass layer 118. Advantageously, the polymer layer 136 has a polymer transmittance substantially equal to a glass transmittance of the cover glass layer 118. In this manner, the display device 104 provides a consistent transparency and transmittance from the light-emitting layer 153 across the entire cover glass layer 118, including within the folding portion 130. In some examples, such transmittance may be approximately 100%. Accordingly, display devices of the present disclosure can provide full 360 rotation capabilities while also presenting consistent transparency and transmittance performance, including within the folding portion 130. In some examples, the polymer layer 136 comprises an acrylic polymer that exhibits an optical index that matches the corresponding optical index of the cover glass layer 118.

Figure 19:
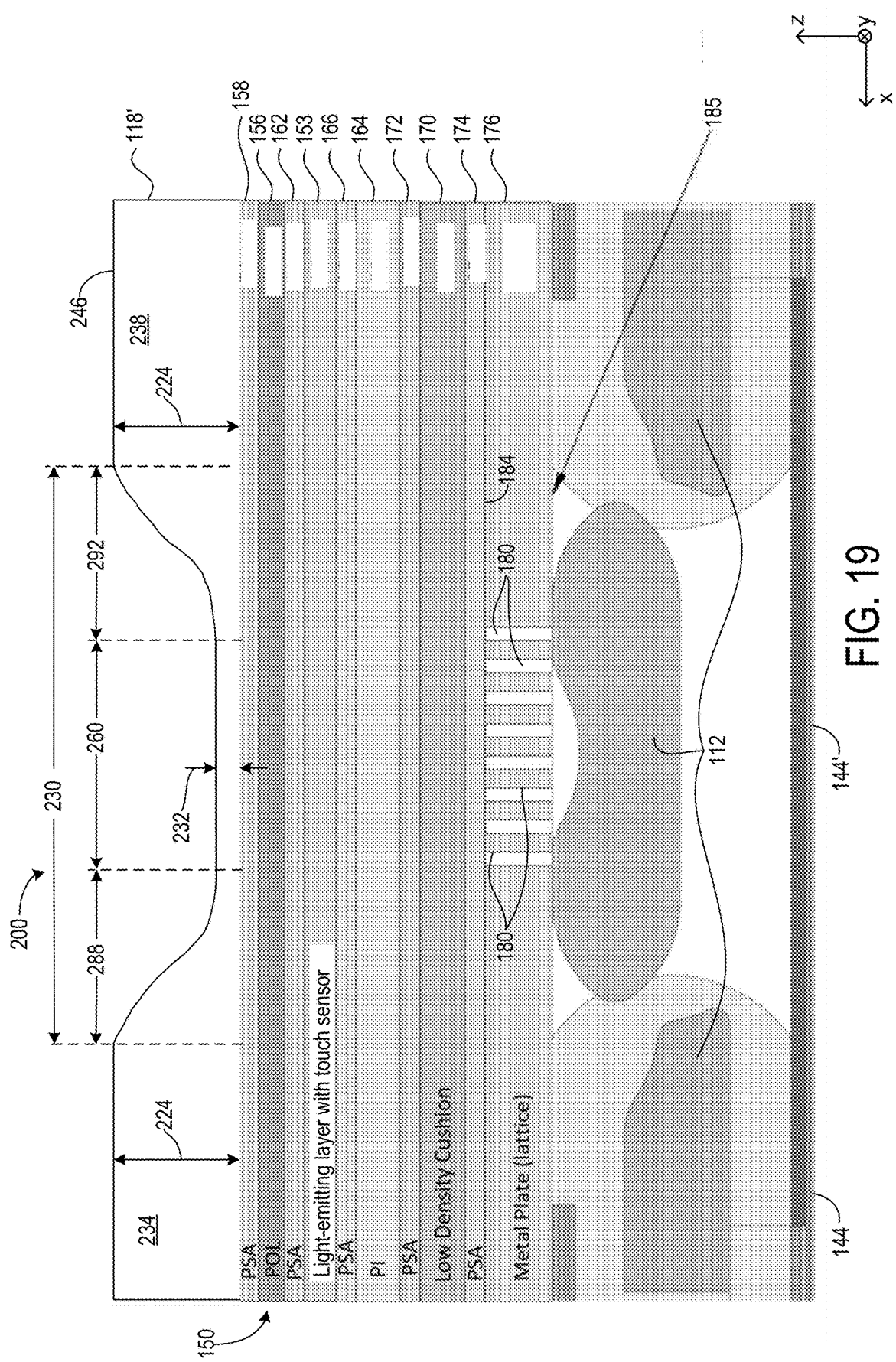
FIG. 19 shows a partial schematic cross section of another example of the display device of FIG. 1A taken through section line 5-5 according to examples of the present disclosure.

With reference now to FIG. 19, a partial schematic cross section of another example of display device 104 taken through section line 5-5 in FIG. 1A is illustrated. In this example and as described above, the second backplate 176 between rear cover 144 and a light-emitting layer 153 includes a plurality of backplate slots 180 that each extend from an upper surface 184 of the second backplate through a lower surface 185 of the second backplate to facilitate bending of the backplate. In this example, the cover glass layer 118' has a recessed area 200 at the folding portion 230 when the display device is in a 180 degree orientation, as shown in FIG. 19, to facilitate folding of the cover glass layer 118'. The other components of the display device shown in FIG. 18 are the same as described above for FIG. 5.

Figure 20:
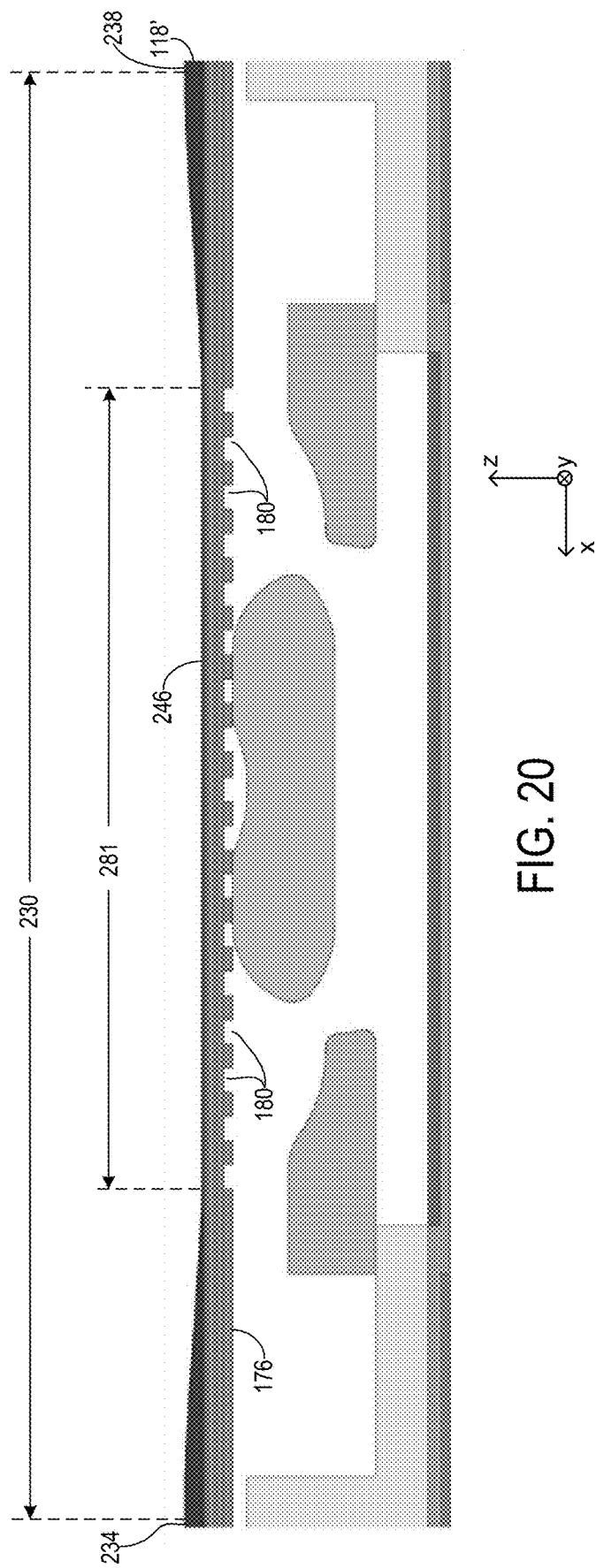
FIG. 20 shows another representation of a partial schematic cross section of the other example of the display device of FIG. 1A taken through section line 5-5 according to examples of the present disclosure.

FIG. 20 shows another representation of the partial cross section of display device 104 depicted in FIG. 19. The components and layers in FIG. 20 are the same as the components and layers in FIG. 19. In this example, a first width 281 of the plurality of backplate slots 180 is less than a second width of the folding portion 230. Additionally, the plurality of backplate slots 180 form a two-dimensional lattice of slots as depicted in FIG. 6 and described above.

As with the examples described above and with reference also to FIG. 1A, in this example the backplate slots 180 are located midway between the left side 122 and the right side 126 of the display device 104. With this configuration and as noted above, the backplate slots 180 provide pliability to the second backplate 176 to enable the second backplate to freely rotate about the folding axis 182 when the display device 104 is rotated through various angles and orientations.

In this example and with reference again to FIG. 19, the folding portion 230 of the cover glass layer 118' includes a thinned portion 260 centered in the folding portion. The thinned portion 260 is joined by a left transition portion (indicated at 288) to the left thick portion 234 of the cover glass layer 118'. Similarly, the thinned portion 260 is joined by a right transition portion (indicated at 292) to the right thick portion 238 of the cover glass layer 118'. The transition portions 288, 292 and thinned portion 260 may be formed in cover glass layer 118' by grinding the cover glass layer, fabricating and processing the cover glass layer with laser modification and wet etching techniques, and/or using any other suitable fabrication techniques.

As shown in FIG. 19, in this example the thinned portion 260 is located adjacent to the other components of the touch display modules 150, and is bonded to the polarizing layer 156 via PSA layer 158. Similarly, the left thick portion 234 and right this portion 238 are also bonded to the polarizing layer 156 via PSA layer 158.

In the present example, the thinned portion 260 of cover glass layer 118' has a second thickness 232 of approximately 35 microns. In other examples, the thinned portion 260 has a second thickness of between approximately 30 microns and approximately 40 microns. Also in the present example, the first thickness 224 of the left thick portion 234 and right thick portion 238 of the cover glass layer 118' is approximately 400 microns. In some examples, the first thickness 124 of the left thick portion 134 and right thick portion 138 is between approximately 350 microns and approximately 450 microns.

In this example, the concave profile of the folding portion 230 enables the thinned portion 260 to be directly bonded to the polarizing layer 156 via PSA layer 158. In this manner, an additional polymer layer between the cover glass layer 118' and the polarizing layer 156 is avoided, thereby simplifying the manufacturing of the display device.

As with the configuration of FIGS. 5-18 described above, this configuration of folding portion 230 including thinned portion 260 in between left and right thick portions 234, 238 enables the display device 104 to be rotated through 360 degrees while also preventing undesirable mechanical creases and visual artifacts at the folding portion. Additionally, by providing the left thick portion 234 and right thick portion 238 of cover glass layer 118' on either side of the thinned portion 260, the majority of the cover glass overlying the touch display module 150 is relatively thicker, such as 0.4 mm. Advantageously, by providing such a thicker layer of cover glass over a majority of the touch display module 150, the present configuration also operates to suppress internal deformations in components of the touch display module and further inhibits formation of mechanical creases at the folding portion.

Figure 21:
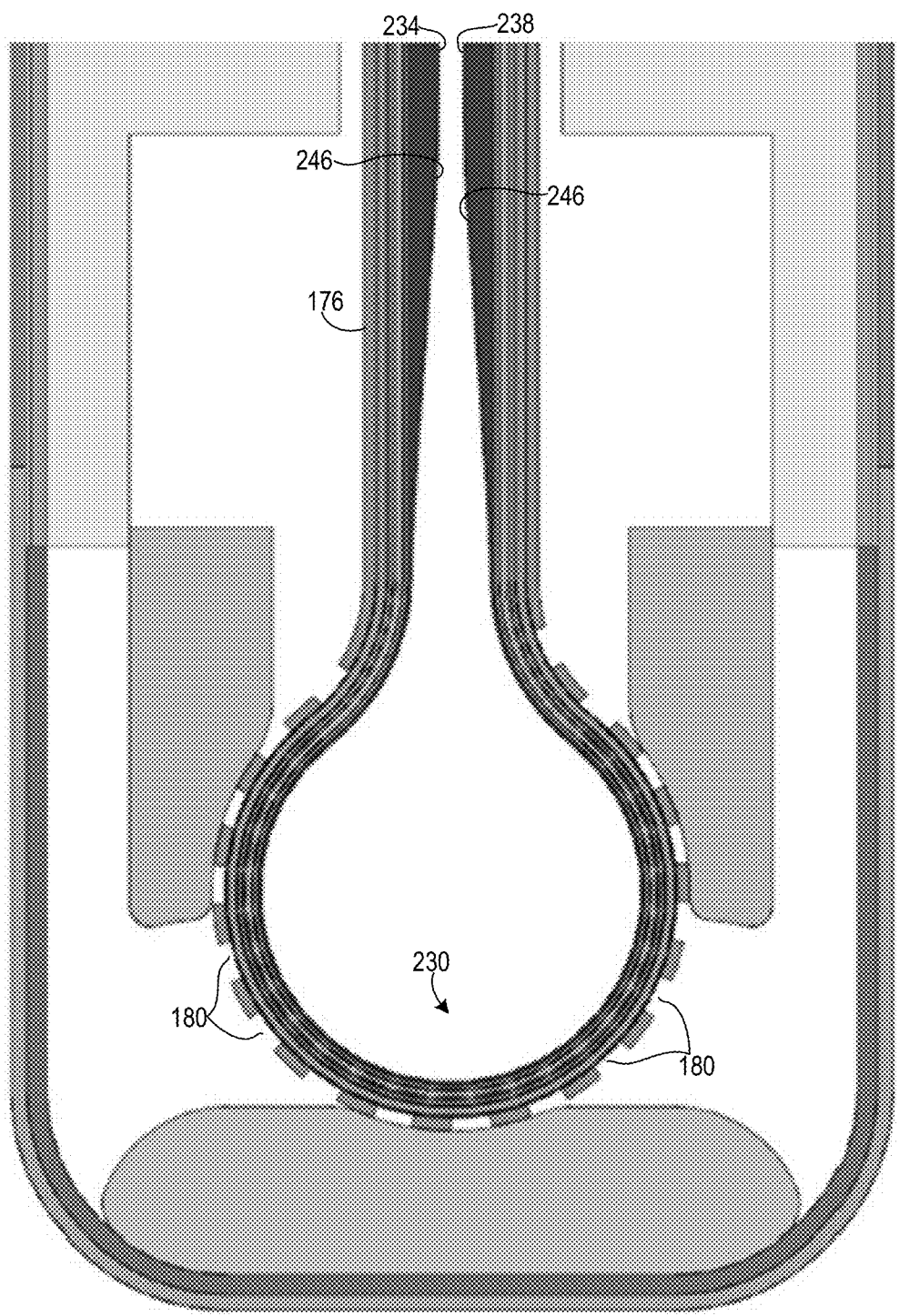
FIG. 21 shows a simplified illustration of the folding portion of the cover glass layer at the zero degree orientation according to examples of the present disclosure.

With reference also to FIGS. 21-24 (not to scale), this configuration of folding portion 230 including thinned portion 260 in between left and right thick portions 234, 238 enables the display device to be rotated through 360 degrees by creating the deformation profiles at the folding portion 230 shown in these figures. As shown in FIG. 21, at a zero degrees orientation the outer surface 246 of the cover glass layer 118' is in a face-to-face orientation. In this orientation, the folding portion 230 forms a circular deformation profile that transitions into a planer configuration in which the left thick portion 234 of the cover glass layer 118' is parallel to and facing the right thick portion 238. Advantageously, this circular deformation profile enables a significant portion of the folding portion 130 to be uniformly distributed around the circular shape to minimize visual discontinuities within the profile.

Figure 22:
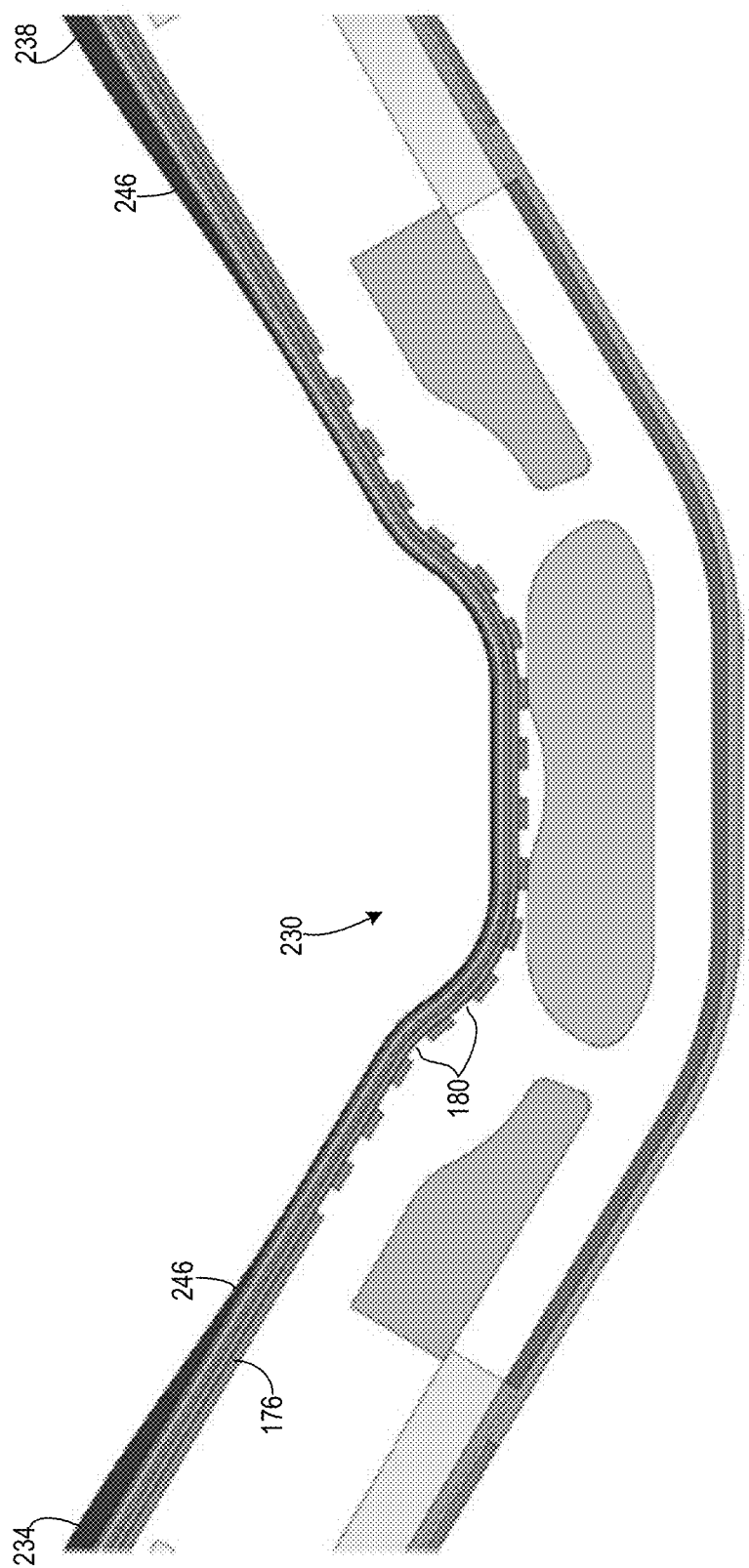
FIG. 22 shows a simplified illustration of the folding portion of the cover glass layer at the 120 degree orientation according to examples of the present disclosure.
Figure 23:
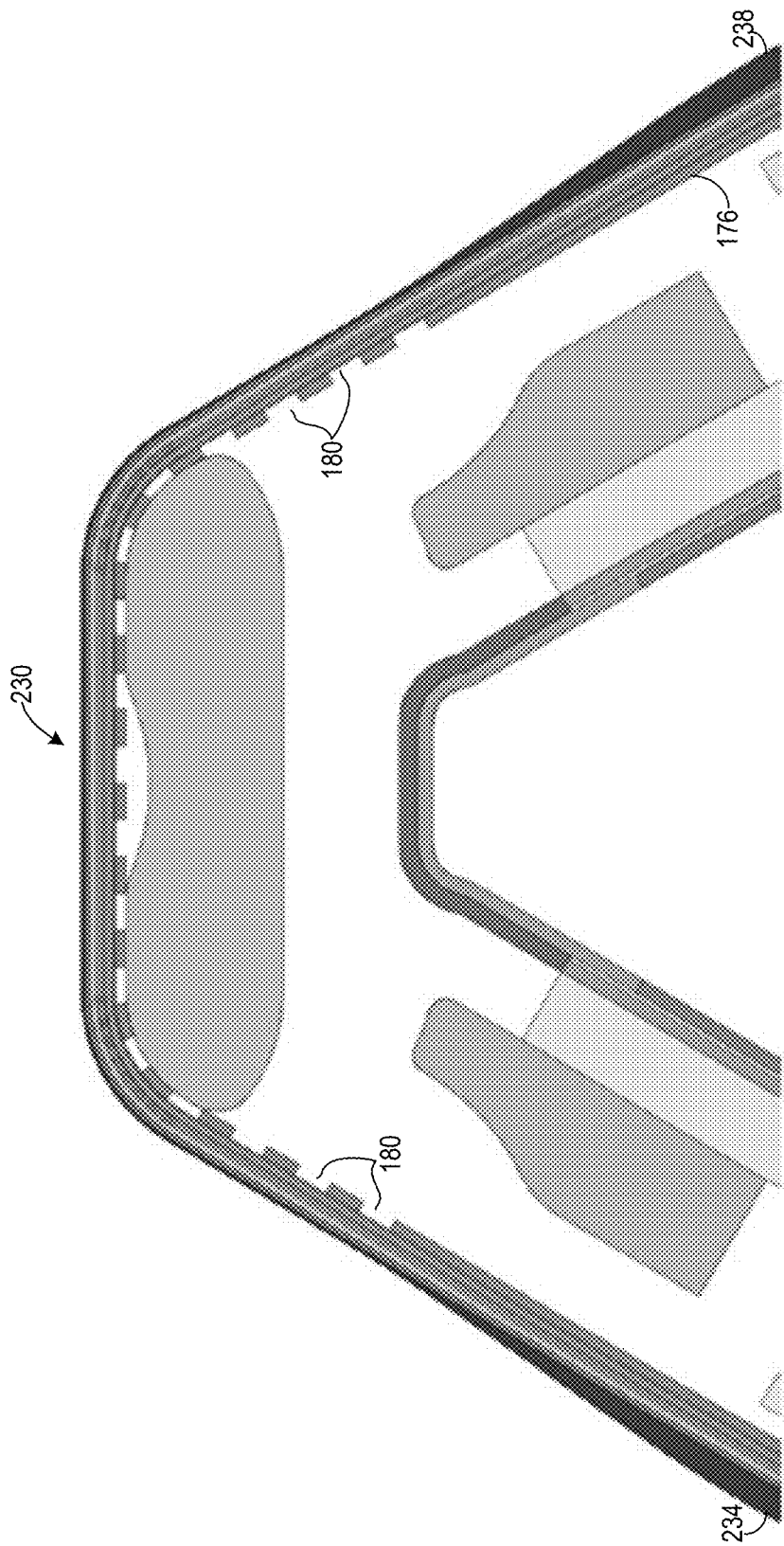
FIG. 23 shows a simplified illustration of the folding portion of the cover glass layer at the 300 degree orientation according to examples of the present disclosure.
Figure 24:
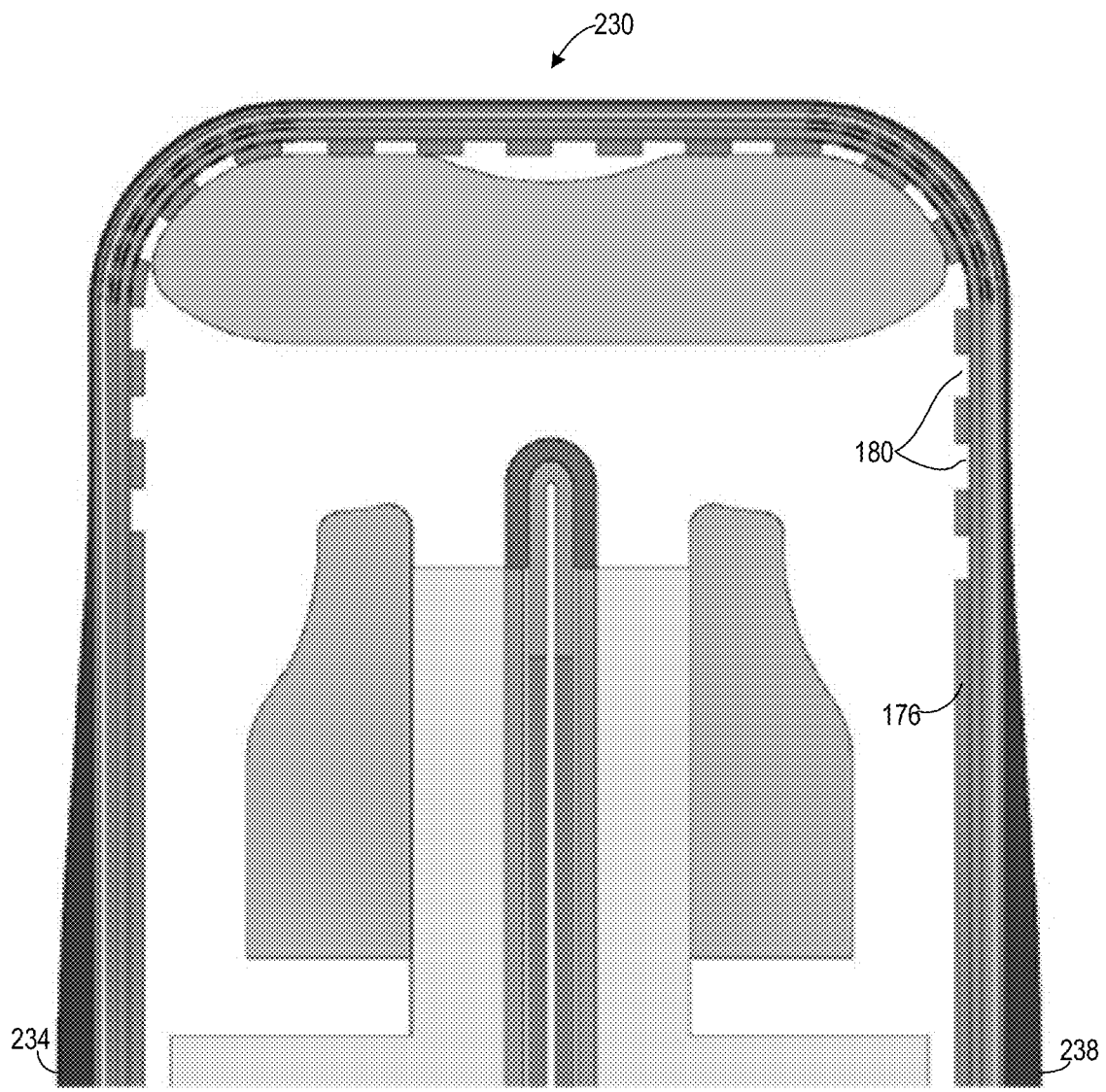
FIG. 24 shows a simplified illustration of the folding portion of the cover glass layer at the 360 degree orientation according to examples of the present disclosure.

FIG. 22 shows cover glass layer 118' in a 120 degree orientation. FIG. 23 shows the cover glass layer 118' in a 300 degree orientation. FIG. 24 shows the cover glass layer 118' and display device in a 360 degree orientation, where the outer surface 246 of cover glass layer is in a back-to-back orientation with left thick portion 234 of the cover glass layer facing in a direction opposite to the right thick portion 238. As shown in these figures, in this orientation the cover glass layer forms a right-angled U-shape deformation profile that transitions into a planer configuration in which the left thick portion 234 of the cover glass layer 118' is parallel to and facing in a direction opposite to the right thick portion 238. Advantageously, this U-shaped deformation profile distributes internal stresses evenly across two curved portions of the folding portion 230.

Figure 25:
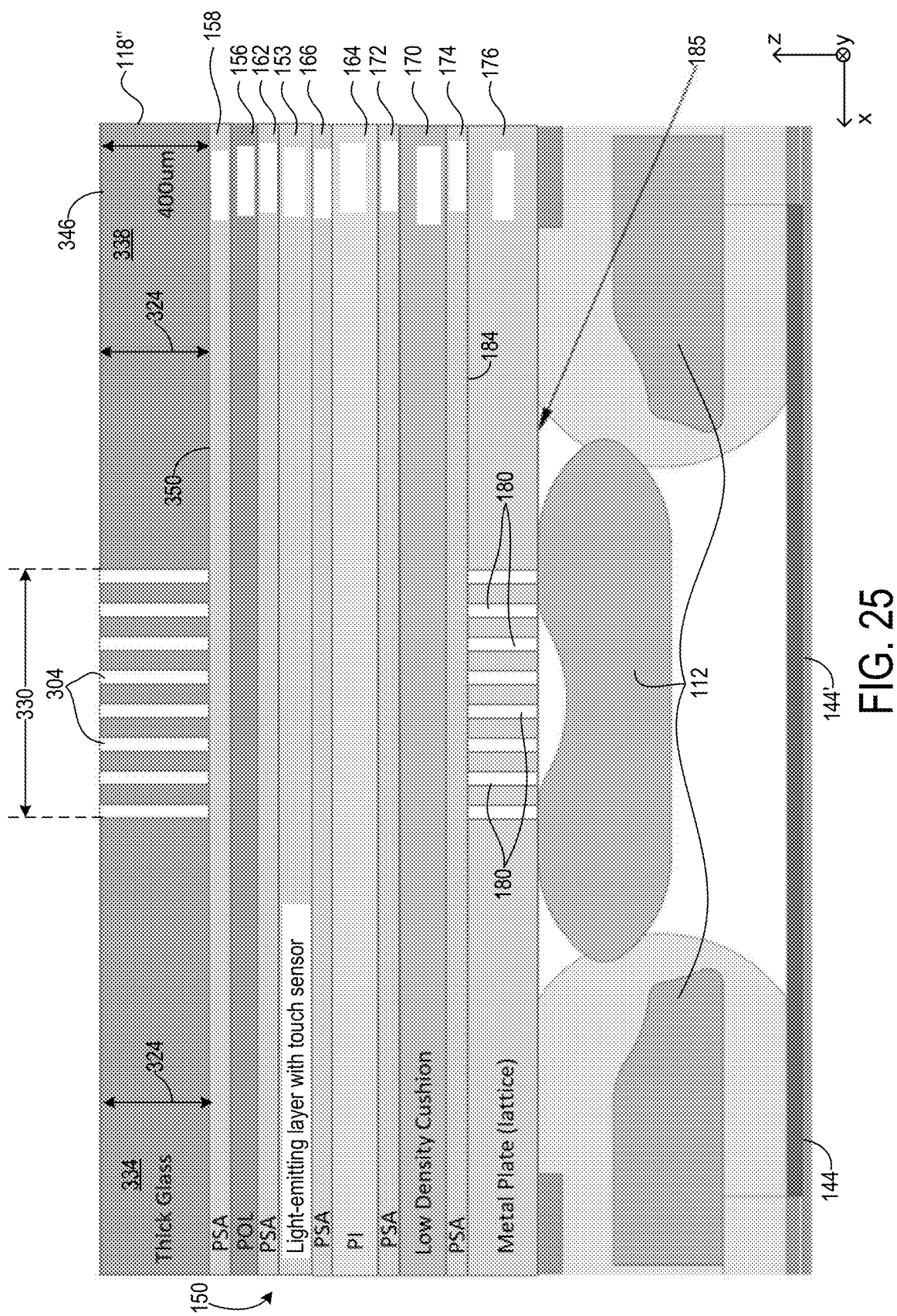
FIG. 25 shows a partial schematic cross section of another example of the display device of FIG. 1A taken through section line 5-5 according to examples of the present disclosure.

With reference now to FIG. 25, a partial schematic cross section of another example of display device 104 taken through section line 5-5 in FIG. 1 is illustrated. In this example and as described above, the second backplate 176 between rear cover 144 and a light-emitting layer 153 includes a plurality of backplate slots 180 that each extend from an upper surface 184 of the second backplate through a lower surface 185 of the second backplate to facilitate bending of the backplate. In this example, the cover glass layer 118" has a uniform thickness 324 and includes plurality of cover glass layer slots 304 in the folding portion 330 to facilitate folding of the cover glass layer. As shown in FIG. 25, the plurality of cover glass layer slots 304 extend from an outer surface 346 of the cover glass layer towards the light-emitting layer 153. The other components of the display device shown in FIG. 24 are the same as described above for FIG. 5.

Figure 26:
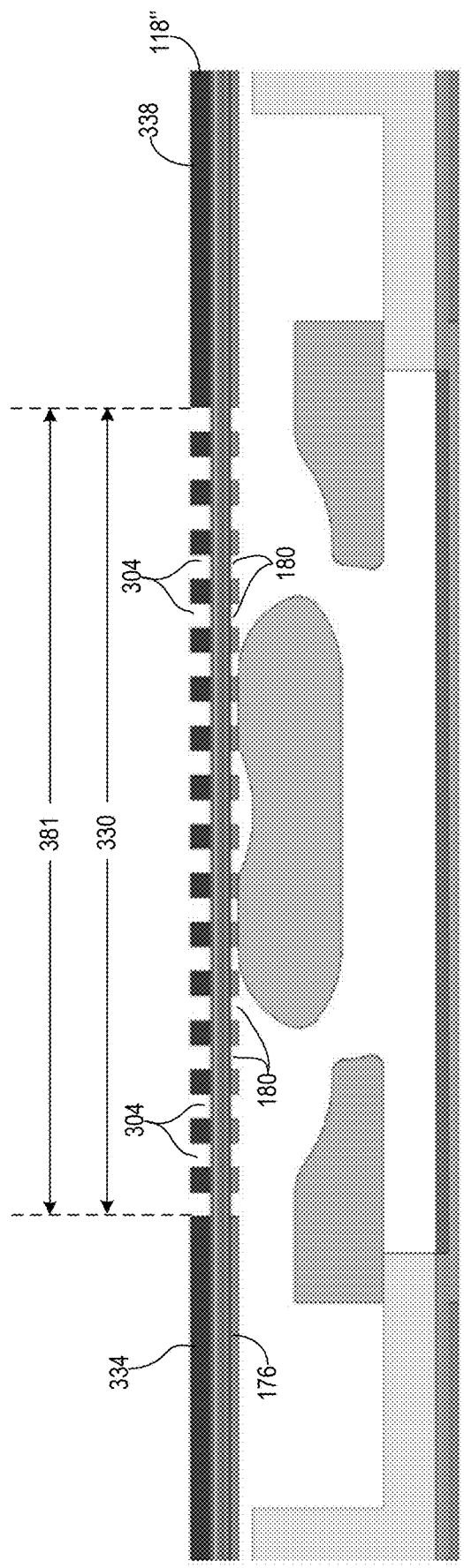
FIG. 26 shows another representation of a partial schematic cross section of this example of the display device of FIG. 1A taken through section line 5-5 according to examples of the present disclosure.

FIG. 26 shows another representation of the partial cross section of display device 104 depicted in FIG. 25. The components and layers in FIG. 26 are the same as the components and layers in FIG. 25. In this example, a first width 381 of the plurality of backplate slots 180 is substantially the same as a second width of the folding portion 330. Additionally, the plurality of backplate slots 180 form a two-dimensional lattice of slots as depicted in FIG. 6 and described above.

As with the examples described above and with reference also to FIG. 1A, in this example the backplate slots 180 are located midway between the left side 122 and the right side 126 of the display device 104. Additionally, the cover glass layer slots 304 are positioned opposite to the backplate slots 180 to facilitate bending of the second backplate 176 along with the cover glass layer 118" and components of the touch display module 150 therebetween. With this configuration and as noted above, the backplate slots 180 provide pliability to the second backplate 176 to enable the second backplate to freely rotate about the folding axis 182 when the display device 104 is rotated through various angles and orientations.

Additionally and as shown in in FIGS. 25 and 26, in this example the first width 381 of the backplate slots 180 is substantially equal to a second width of the cover glass layer slots 304 that form the folding portion 330. With this configuration, the matching widths of the backplate slots 180 and cover glass layer slots 304 can provide uniform flexibility across the folding portion 330. In other examples, the width of the backplate slots 180 may be greater than the width of the cover glass layer slots 304 forming the folding portion 330. In these examples, the wider span of backplate slots 180 can afford greater flexibility to layers beyond the folding portion 330 as the cover glass layer 118" is rotated through various angles.

In this example, the outer surface 346 and bottom surface 350 of the cover glass layer 118" are both planar and parallel to one another. Accordingly, this configuration enables the bottom surface 350 to be bonded directly to the polarizing layer 156 via PSA layer 158. In this manner, an additional polymer layer between the cover glass layer 118" and the polarizing layer 156 is avoided, thereby simplifying the manufacturing of the display device.

In the present example, the uniform thickness 324 of the cover glass layer 118" is approximately 400 microns. In other examples, the uniform thickness 324 is between approximately 350 microns and approximately 450 microns.

The cover glass layer slots 304 may be formed in cover glass layer 118' by fabricating and processing the cover glass layer with laser modification and wet etching techniques. In other examples, any other suitable fabrication techniques may be utilized to form the cover glass layer slots 304.

This configuration of cover glass layer slots 304 within folding portion 330 enables the display device 104 to be rotated through 360 degrees while also preventing undesirable mechanical creases at the folding portion. Additionally, by providing a uniform thickness 324, such as 400 microns, across the entirety of the cover glass layer 118", this present configuration also operates to suppress internal deformations in components of the touch display module and further inhibit formation of mechanical creases at the folding portion 330.

Figure 27:
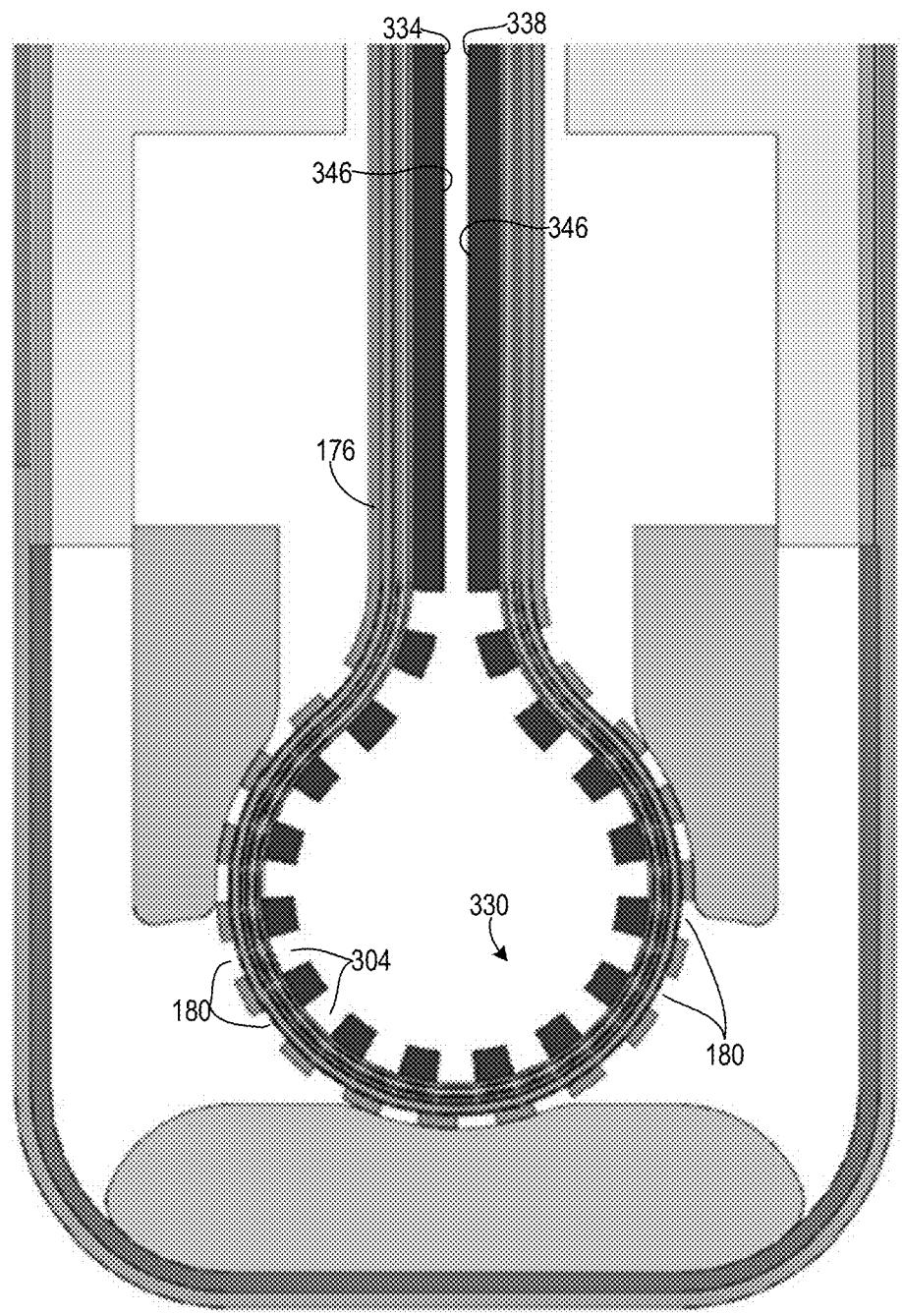
FIG. 27 shows a simplified illustration of the folding portion of the cover glass layer at the zero degree orientation according to examples of the present disclosure.

With reference also to FIGS. 27-30 (not to scale), this configuration of folding portion 330 including cover glass layer slots 304 enables the display device to be rotated through 360 degrees by creating the deformation profiles at the folding portion 330 shown in these figures. As shown in FIG. 27, at a zero degrees orientation the outer surface 346 of the cover glass layer 118" is in a face-to-face orientation. In this orientation, the folding portion 330 forms a circular deformation profile that transitions into a planer configuration in which the left portion 334 of the cover glass layer 118" is parallel to and facing the right portion 338. Advantageously, this circular deformation profile enables a significant portion of the folding portion 330 to be uniformly distributed around the circular shape to minimize visual discontinuities within the profile.

Figure 28:
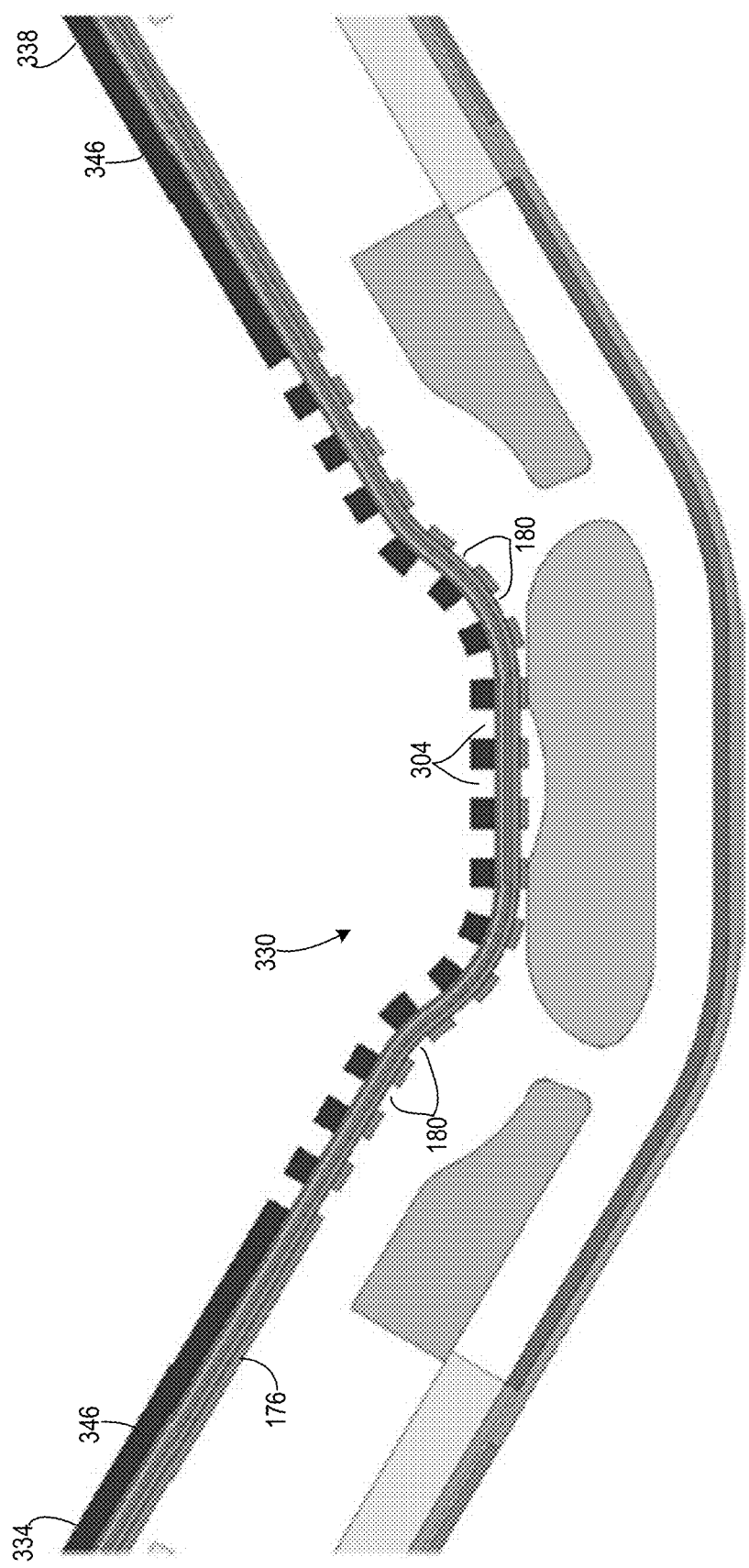
FIG. 28 shows a simplified illustration of the folding portion of the cover glass layer at the 120 degree orientation according to examples of the present disclosure.
Figure 29:
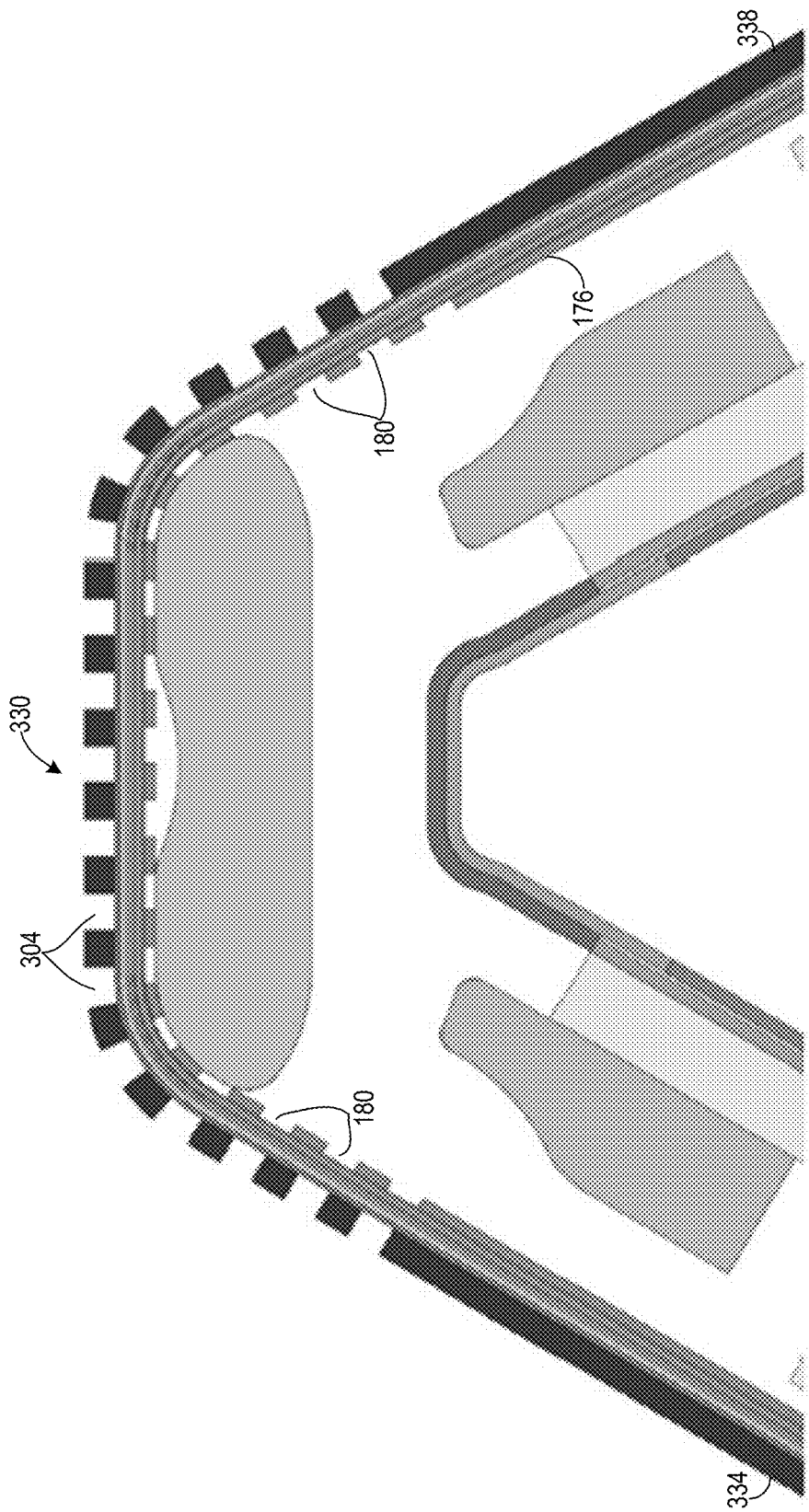
FIG. 29 shows a simplified illustration of the folding portion of the cover glass layer at the 300 degree orientation according to examples of the present disclosure.
Figure 30:
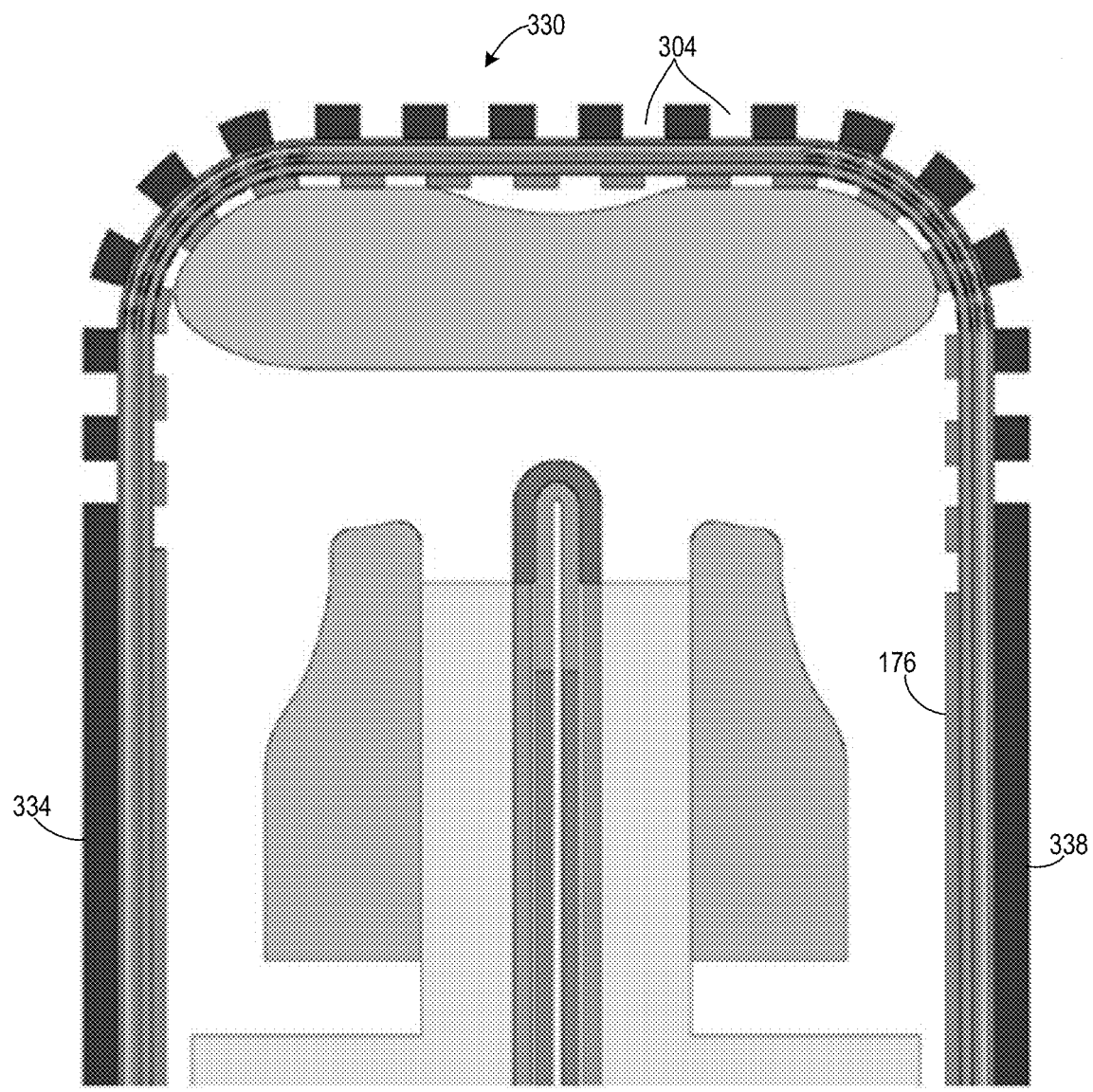
FIG. 30 shows a simplified illustration of the folding portion of the cover glass layer at the 360 degree orientation according to examples of the present disclosure.

FIG. 28 shows cover glass layer 118" in a 120 degree orientation. FIG. 29 shows the cover glass layer 118" in a 300 degree orientation. FIG. 30 shows the cover glass layer 118" and display device in a 360 degree orientation, where the outer surface 346 of cover glass layer is in a back-to-back orientation with left portion 334 of the cover glass layer facing in a direction opposite to the right portion 338. As shown in these figures, in this orientation the cover glass layer 118" forms a right-angled U-shape deformation profile that transitions into a planer configuration in which the left portion 334 of the cover glass layer 118" is parallel to and facing in a direction opposite to the right portion 338. Advantageously, this U-shaped deformation profile distributes internal stresses evenly across two curved portions of the folding portion 330.

Figure 31:
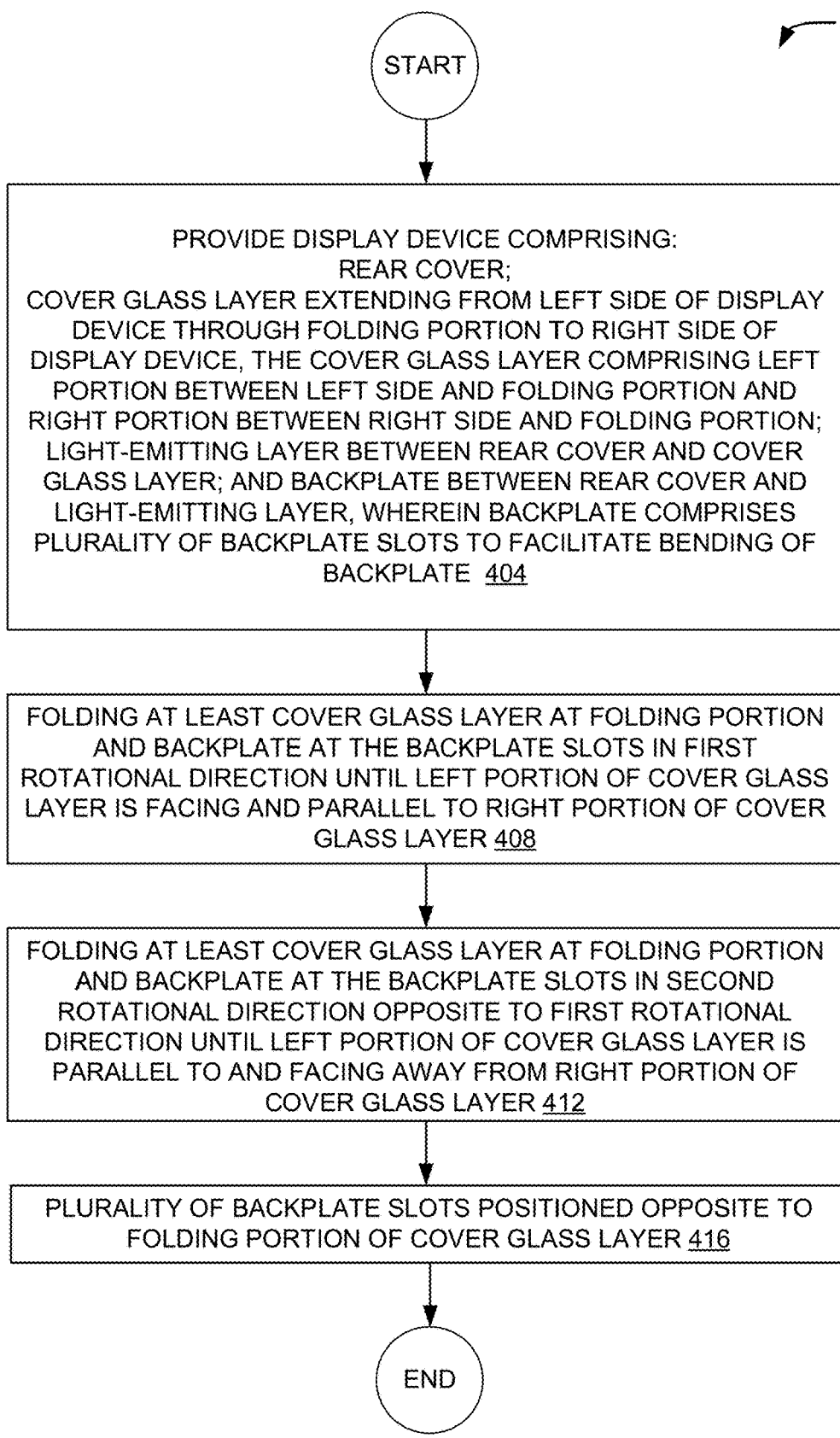
FIG. 31 shows a flow diagram of an example method for folding a display device through a range of degrees at a folding portion according to examples of the present disclosure.

With reference now to FIG. 31, a flow diagram is illustrated depicting an example method 400 for folding a display device through a range of degrees at a folding portion. The following description of method 400 is provided with reference to the display devices and components described herein and shown in FIGS. 1-30.

It will be appreciated that following description of method 400 is provided by way of example and is not meant to be limiting. Therefore, it is to be understood that method 400 may include additional and/or alternative steps relative to those illustrated in FIG. 31. Further, it is to be understood that the steps of method 400 may be performed in any suitable order. Further still, it is to be understood that one or more steps may be omitted from method 400 without departing from the scope of this disclosure. It will also be appreciated that method 400 also may be performed in other contexts using other suitable components.

With reference to FIG. 31, at 404 the method 400 includes providing a display device comprising a rear cover; a cover glass layer extending from a left side of the display device through the folding portion to a right side of the display device, the cover glass layer comprising a left portion between the left side and the folding portion and a right portion between the right side and the folding portion; a light-emitting layer between the rear cover and the cover glass layer; and a backplate between the rear cover and the light-emitting layer, wherein the backplate comprises a plurality of backplate slots to facilitate bending of the backplate.

At 408 the method 400 includes folding at least the cover glass layer at the folding portion in a first rotational direction until the left portion of the cover glass layer is facing and parallel to the right portion of the cover glass layer. At 412 the method 400 includes folding at least the cover glass layer at the folding portion in a second rotational direction opposite to the first rotational direction until the left portion of the cover glass layer is parallel to and facing away from the right portion of the cover glass layer. At 416 the method 400 includes wherein the plurality of backplate slots is positioned opposite to the folding portion of the cover glass layer.

Figure 32:
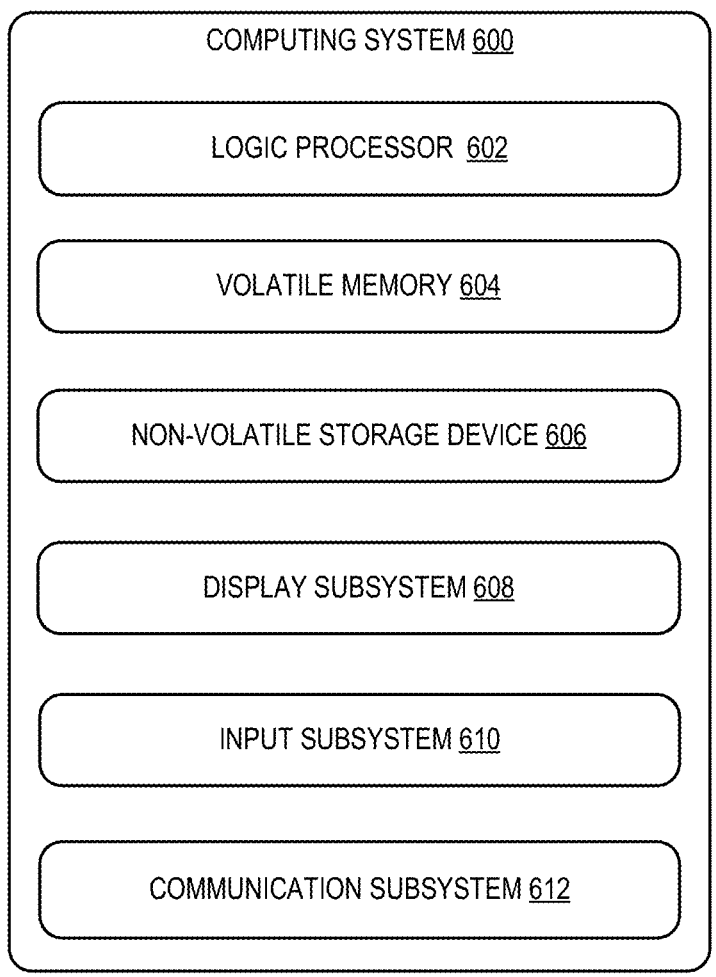
FIG. 32 shows a block diagram of an example computing system according to examples of the present disclosure.

In some embodiments, the display devices described herein may incorporate one or more computing devices. FIG. 32 schematically shows a non-limiting embodiment of a computing system 600 that may be utilized in one or more of the display devices discussed above. Computing system 600 is shown in simplified form. The display device 104 described herein may comprise computing system 600 or one or more aspects of computing system 600.

Computing system 600 includes a logic processor 602, volatile memory 604, and a non-volatile storage device 606. Computing system 600 may optionally include a display subsystem 608, input subsystem 610, communication subsystem 612, and/or other components not shown in FIG. 32.

Logic processor 602 includes one or more physical devices configured to execute instructions. For example, the logic processor may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 602 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Volatile memory 604 may include physical devices that include random access memory (RAM). Volatile memory 604 is typically utilized by logic processor 602 to temporarily store information during processing of software instructions. It will be appreciated that volatile memory 604 typically does not continue to store instructions when power is cut to the volatile memory 604.

Non-volatile storage device 606 includes one or more physical devices configured to hold instructions executable by the logic processors to implement the methods and processes described herein. When such methods and processes are implemented, the state of non-volatile storage device 606 may be transformed—e.g., to hold different data.

Non-volatile storage device 606 may include physical devices that are removable and/or built-in. Non-volatile storage device 606 may include optical memory (e.g., CD, DVD, HD-DVD, Blu-Ray Disc, etc.), semiconductor memory (e.g., ROM, EPROM, EEPROM, FLASH memory, etc.), magnetic memory (e.g., hard-disk drive, floppy-disk drive, tape drive, MRAM, etc.), and/or other mass storage device technology. Non-volatile storage device 606 may include nonvolatile, dynamic, static, read/write, read-only, sequential-access, location-addressable, file-addressable, and/or content-addressable devices. It will be appreciated that non-volatile storage device 606 is configured to hold instructions even when power is cut to the non-volatile storage device 606.

Aspects of logic processor 602, volatile memory 604, and non-volatile storage device 606 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The terms "module," "program," and "engine" may be used to describe an aspect of computing system 600 typically implemented in software by a processor to perform a particular function using portions of volatile memory, which function involves transformative processing that specially configures the processor to perform the function. Thus, a module, program, or engine may be instantiated via logic processor 602 executing instructions held by non-volatile storage device 606, using portions of volatile memory 604. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 608 may be used to present a visual representation of data held by non-volatile storage device 606. As the herein described methods and processes change the data held by the non-volatile storage device, and thus transform the state of the non-volatile storage device, the state of display subsystem 608 may likewise be transformed to visually represent changes in the underlying data. Display subsystem 608 may include one or more display devices utilizing virtually any type of technology. Such display devices may be combined with logic processor 602, volatile memory 604, and/or non-volatile storage device 606 in a shared enclosure, or such display devices may be peripheral display devices.

When included, input subsystem 610 may comprise or interface with one or more user-input devices such as a keyboard, mouse, touch screen, electronic pen, stylus, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 612 may be configured to communicatively couple various computing devices described herein with each other, and with other devices. Communication subsystem 612 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 600 to send and/or receive messages to and/or from other devices via a network such as the Internet.

The following paragraphs provide additional support for the claims of the subject application. One aspect provides a display device foldable through a range of degrees at a folding portion, the display device comprising: a rear cover; a cover glass layer extending from a left side of the display device through the folding portion to a right side of the display device; a light-emitting layer between the rear cover and the cover glass layer; and a backplate between the rear cover and the light-emitting layer, wherein the backplate comprises a plurality of backplate slots that each extend from an upper surface of the backplate through a lower surface of the backplate to facilitate bending of the backplate. The computing device may additionally or alternatively include, wherein the plurality of backplate slots form a two-dimensional lattice of slots. The computing device may additionally or alternatively include, wherein each backplate slot of the plurality of backplate slots comprises a longitudinal axis that extends parallel to a folding axis about which the display device folds.

The computing device may additionally or alternatively include, wherein the backplate slots are arranged in a plurality of rows that each extend parallel to the folding axis about which the display device folds. The computing device may additionally or alternatively include, wherein each backplate slot in a first row of the plurality of rows is offset along the folding axis with respect to each backplate slot in a second row of the plurality of rows adjacent to the first row. The computing device may additionally or alternatively include, wherein the plurality of backplate slots is positioned opposite to the folding portion of the cover glass layer. The computing device may additionally or alternatively include, wherein a first width of the plurality of backplate slots is less than a second width of the folding portion. The computing device may additionally or alternatively include, wherein a first width of the plurality of backplate slots is equal to or greater than a second width of the folding portion. The computing device may additionally or alternatively include, wherein the cover glass layer has a first thickness outside the folding portion and a second thickness within the folding portion, wherein the second thickness within the folding portion is less than the first thickness outside the folding portion to facilitate folding of the cover glass layer. Another aspect provides a display device foldable through a range of degrees at a folding portion, the display device comprising: a rear cover; a cover glass layer extending from a left side of the display device through the folding portion to a right side of the display device, the cover glass layer comprising a plurality of cover glass layer slots in the folding portion to facilitate folding of the cover glass layer; a light-emitting layer between the rear cover and the cover glass layer; and a backplate between the rear cover and the light-emitting layer, wherein the backplate comprises a plurality of backplate slots that each extend from an upper surface of the backplate through a lower surface of the backplate to facilitate bending of the backplate. The display device may additionally or alternatively include, wherein the plurality of backplate slots form a two-dimensional lattice of slots. The display device may additionally or alternatively include, wherein each backplate slot of the plurality of backplate slots comprises a longitudinal axis that extends parallel to a folding axis about which the display device folds. The display device may additionally or alternatively include, wherein the backplate slots are arranged in a plurality of rows that each extend parallel to the folding axis about which the display device folds. The display device may additionally or alternatively include, wherein each backplate slot in a first row of the plurality of rows is offset along the folding axis with respect to each backplate slot in a second row of the plurality of rows adjacent to the first row. The display device may additionally or alternatively include, wherein the plurality of cover glass layer slots extends from an outer surface of the cover glass layer towards the light-emitting layer. The display device may additionally or alternatively include, wherein a first width of the plurality of backplate slots is equal to or greater than a second width of the cover glass layer slots. The display device may additionally or alternatively include, wherein the backplate slots are positioned opposite to the cover glass layer slots. The display device may additionally or alternatively include, wherein the plurality of backplate slots is located midway between the left side and the right side of the display device.

Another aspect provides a method for folding a display device through a range of degrees at a folding portion, the method comprising: providing the display device, the display device comprising: a rear cover; a cover glass layer extending from a left side of the display device through the folding portion to a right side of the display device; a light-emitting layer between the rear cover and the cover glass layer; and a backplate between the rear cover and the light-emitting layer, wherein the backplate comprises a plurality of backplate slots to facilitate bending of the backplate; folding at least the cover glass layer at the folding portion and the backplate at the backplate slots in a first rotational direction until the left portion of the cover glass layer is facing and parallel to the right portion of the cover glass layer; and folding at least the cover glass layer at the folding portion and the backplate at the backplate slots in a second rotational direction opposite to the first rotational direction until the left portion of the cover glass layer is parallel to and facing away from the right portion of the cover glass layer. The method may additionally or alternatively include, wherein the plurality of backplate slots is positioned opposite to the folding portion of the cover glass layer.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A display device foldable through a range of degrees at a folding portion, the display device comprising:
   a rear cover;
   a cover glass layer comprising the folding portion and extending from a left side of the display device through the folding portion to a right side of the display device, the cover glass layer being a topmost layer of the display device, wherein the folding portion is defined by a left arcuate tapering transition portion that joins a left side portion of the cover glass layer with a thinned portion that is centered in the folding portion, and the folding portion is defined by a right arcuate tapering transition portion that joins a right side portion of the cover glass layer with the centered thinned portion, wherein the left side portion and the right side portion of the cover glass layer have a first thickness, and the centered thinned portion has a second thickness less than the first thickness to facilitate folding of the cover glass layer;
   a light-emitting layer between the rear cover and the cover glass layer; and
   a backplate between the rear cover and the light-emitting layer, wherein the backplate comprises a plurality of backplate slots that each extend from an upper surface of the backplate through a lower surface of the backplate to facilitate bending of the backplate.

2. The display device of claim 1, wherein the plurality of backplate slots form a two-dimensional lattice of slots.

3. The display device of claim 1, wherein each backplate slot of the plurality of backplate slots comprises a longitudinal axis that extends parallel to a folding axis about which the display device folds.

4. The display device of claim 3, wherein the backplate slots are arranged in a plurality of rows that each extend parallel to the folding axis about which the display device folds.

5. The display device of claim 4, wherein each backplate slot in a first row of the plurality of rows is offset along the folding axis with respect to each backplate slot in a second row of the plurality of rows adjacent to the first row.

6. The display device of claim 1, wherein the plurality of backplate slots is positioned opposite to the folding portion of the cover glass layer.

7. The display device of claim 1, wherein a first width of the plurality of backplate slots is less than a second width of the folding portion.

8. The display device of claim 1, wherein a first width of the plurality of backplate slots is equal to or greater than a second width of the folding portion.

9. A display device foldable through a range of degrees at a folding portion, the display device comprising:
   a rear cover;
   a cover glass layer comprising the folding portion and extending from a left side of the display device through the folding portion to a right side of the display device, the cover glass layer comprising a plurality of cover glass layer slots in the folding portion to facilitate folding of the cover glass layer, the cover glass layer being a topmost layer of the display device, wherein the folding portion is defined by a left arcuate tapering transition portion that joins a left side portion of the cover glass layer with a thinned portion that is centered in the folding portion, and the folding portion is defined by a right arcuate tapering transition portion that joins a right side portion of the cover glass layer with the centered thinned portion, wherein the left side portion and the right side portion of the cover glass layer have a first thickness, and the centered thinned portion has a second thickness less than the first thickness to facilitate folding of the cover glass layer;
   a light-emitting layer between the rear cover and the cover glass layer; and
   a backplate between the rear cover and the light-emitting layer, wherein the backplate comprises a plurality of backplate slots that each extend from an upper surface of the backplate through a lower surface of the backplate to facilitate bending of the backplate.

10. The display device of claim 9, wherein the plurality of backplate slots form a two-dimensional lattice of slots.

11. The display device of claim 9, wherein each backplate slot of the plurality of backplate slots comprises a longitudinal axis that extends parallel to a folding axis about which the display device folds.

12. The display device of claim 11, wherein the backplate slots are arranged in a plurality of rows that each extend parallel to the folding axis about which the display device folds.

13. The display device of claim 12, wherein each backplate slot in a first row of the plurality of rows is offset along the folding axis with respect to each backplate slot in a second row of the plurality of rows adjacent to the first row.

14. The display device of claim 9, wherein the plurality of cover glass layer slots extends from an outer surface of the cover glass layer towards the light-emitting layer.

15. The display device of claim 9, wherein a first width of the plurality of backplate slots is equal to or greater than a second width of the cover glass layer slots.

16. The display device of claim 9, wherein the backplate slots are positioned opposite to the cover glass layer slots.

17. The display device of claim 9, wherein the plurality of backplate slots is located midway between the left side and the right side of the display device.

18. A method for folding a display device through a range of degrees at a folding portion, the method comprising:
   providing the display device, the display device comprising:
      a rear cover;
      a cover glass layer comprising the folding portion and extending from a left side of the display device through the folding portion to a right side of the display device, the cover glass layer being a topmost layer of the display device, wherein the folding portion is defined by a left arcuate tapering transition portion that joins a left side portion of the cover glass layer with a thinned portion that is centered in the folding portion, and the folding portion is defined by a right arcuate tapering transition portion that joins a right side portion of the cover glass layer with the centered thinned portion, wherein the left side portion and the right side portion of the cover glass layer have a first thickness, and the centered thinned portion has a second thickness less than the first thickness to facilitate folding of the cover glass layer;

a light-emitting layer between the rear cover and the cover glass layer; and a backplate between the rear cover and the light-emitting layer, wherein the backplate comprises a plurality of backplate slots to facilitate bending of the backplate;

folding at least the cover glass layer at the folding portion and the backplate at the backplate slots in a first rotational direction until the left portion of the cover glass layer is facing and parallel to the right portion of the cover glass layer; and folding at least the cover glass layer at the folding portion and the backplate at the backplate slots in a second rotational direction opposite to the first rotational direction until the left portion of the cover glass layer is parallel to and facing away from the right portion of the cover glass layer.

19. The method of claim 18, wherein the plurality of backplate slots is positioned opposite to the folding portion of the cover glass layer.

* * * * *